US 9,407,261 B2

(12) United States Patent
Mischel, Jr. et al.

(10) Patent No.: US 9,407,261 B2
(45) Date of Patent: Aug. 2, 2016

(54) APPARATUSES AND METHODS FOR COMBINING MIRRORS WITH ELECTRONICS IN MEDICINE CABINETS

(75) Inventors: James V. Mischel, Jr., Seattle, WA (US); James V. Mischel, Sr., Lynnwood, WA (US)

(73) Assignee: ELECTRIC MIRROR, LLC, Everett, WA (US)

( * ) Notice: Subject to any disclaimer, the term of this patent is extended or adjusted under 35 U.S.C. 154(b) by 285 days.

(21) Appl. No.: 13/068,777

(22) Filed: May 18, 2011

(65) Prior Publication Data

US 2012/0081620 A1   Apr. 5, 2012

Related U.S. Application Data

(60) Provisional application No. 61/395,898, filed on May 18, 2010.

(51) Int. Cl.
*H03K 17/00* (2006.01)
*H03K 17/96* (2006.01)
*H03K 17/78* (2006.01)

(52) U.S. Cl.
CPC .............. *H03K 17/962* (2013.01); *H03K 17/78* (2013.01); *H03K 2217/96077* (2013.01); *H03K 2217/960705* (2013.01); *Y10T 29/49002* (2015.01); *Y10T 29/49105* (2015.01)

(58) Field of Classification Search
USPC ............... 40/714; 340/461; 348/61, 148, 731; 359/443, 507, 512, 609, 871; 362/140
See application file for complete search history.

(56) References Cited

U.S. PATENT DOCUMENTS

| 1,138,552 | A | * | 5/1915 | Goddard | F21V 33/00 362/141 |
| 5,440,425 | A | * | 8/1995 | Kadooka | H05B 3/845 219/219 |
| 5,539,623 | A | * | 7/1996 | Gurz | G09F 13/14 362/20 |
| 5,940,120 | A | * | 8/1999 | Frankhouse | B60R 11/0235 348/148 |
| 6,124,886 | A | * | 9/2000 | DeLine | B60Q 1/2665 340/433 |
| 6,554,098 | B1 | * | 4/2003 | Komura | H04R 1/02 181/173 |
| 7,131,739 | B2 | * | 11/2006 | Sellgren | H05B 3/845 219/219 |
| 7,551,354 | B2 | * | 6/2009 | Horsten | A47G 1/02 359/485.07 |

(Continued)

FOREIGN PATENT DOCUMENTS

JP    2006175065 A  *  7/2006
JP    2009050572 A  *  3/2009

(Continued)

*Primary Examiner* — Dave Czekaj
*Assistant Examiner* — Shanika Brumfield
(74) *Attorney, Agent, or Firm* — Peloquin, PLLC; Mark S. Peloquin, Esq.

(57) ABSTRACT

An apparatus includes a medicine cabinet door. The medicine cabinet door has an outer glass layer, the outer glass layer has a front side and a back side, an information display is mounted on the back side of the outer glass layer, such that a user can view an image displayed on the information display while looking at the front side of the outer glass layer. A method includes placing an information display behind an outer glass layer of a medicine cabinet door and within a volume of the medicine cabinet door.

43 Claims, 20 Drawing Sheets

(56) References Cited

U.S. PATENT DOCUMENTS

| | | | |
|---|---|---|---|
| 2002/0015226 A1* | 2/2002 | Rottcher | G09F 13/12 359/443 |
| 2002/0196333 A1* | 12/2002 | Gorischek | H04N 7/18 348/61 |
| 2005/0005494 A1* | 1/2005 | Way | A47G 1/0622 40/714 |
| 2006/0098288 A1* | 5/2006 | Pan | G02B 5/0221 359/599 |
| 2007/0159316 A1* | 7/2007 | Mischel, Jr. | A47G 1/02 340/461 |
| 2008/0212218 A1* | 9/2008 | Mischel | G09F 19/14 359/871 |
| 2009/0067075 A1* | 3/2009 | Porter, III | A45D 27/29 359/871 |
| 2009/0213604 A1* | 8/2009 | Uken | B60R 1/12 362/494 |
| 2009/0225519 A1* | 9/2009 | Mischel, Jr. | G09F 9/00 361/724 |
| 2009/0231836 A1* | 9/2009 | Mischel, Jr. | A47G 1/02 362/140 |
| 2010/0118520 A1* | 5/2010 | Stern | A45D 42/10 362/135 |

FOREIGN PATENT DOCUMENTS

| | | | |
|---|---|---|---|
| NL | WO 9635313 A1 * | 11/1996 | G10K 11/1788 |
| WO | WO 9635313 A1 * | 11/1996 | H04R 17/00 |

* cited by examiner

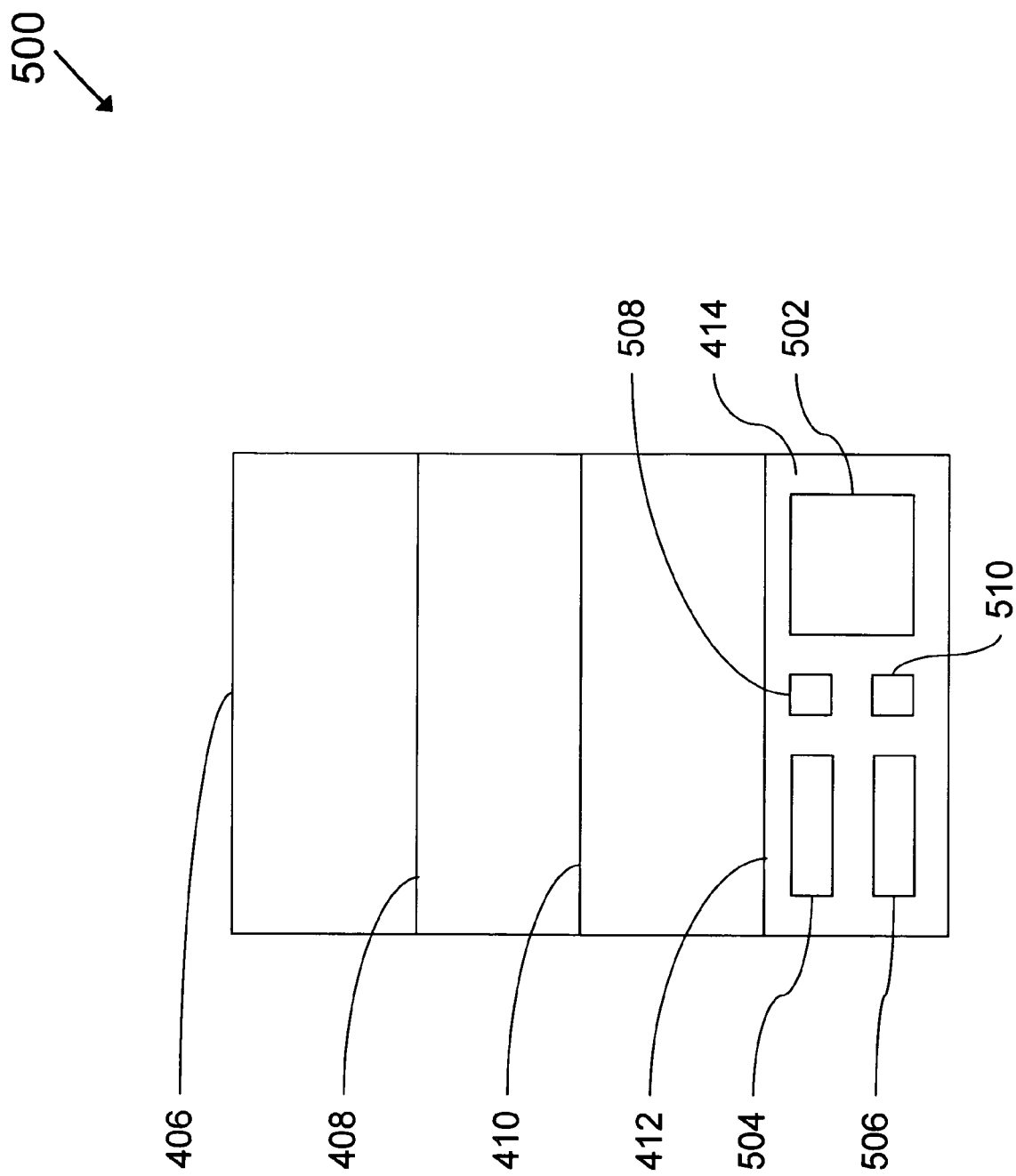

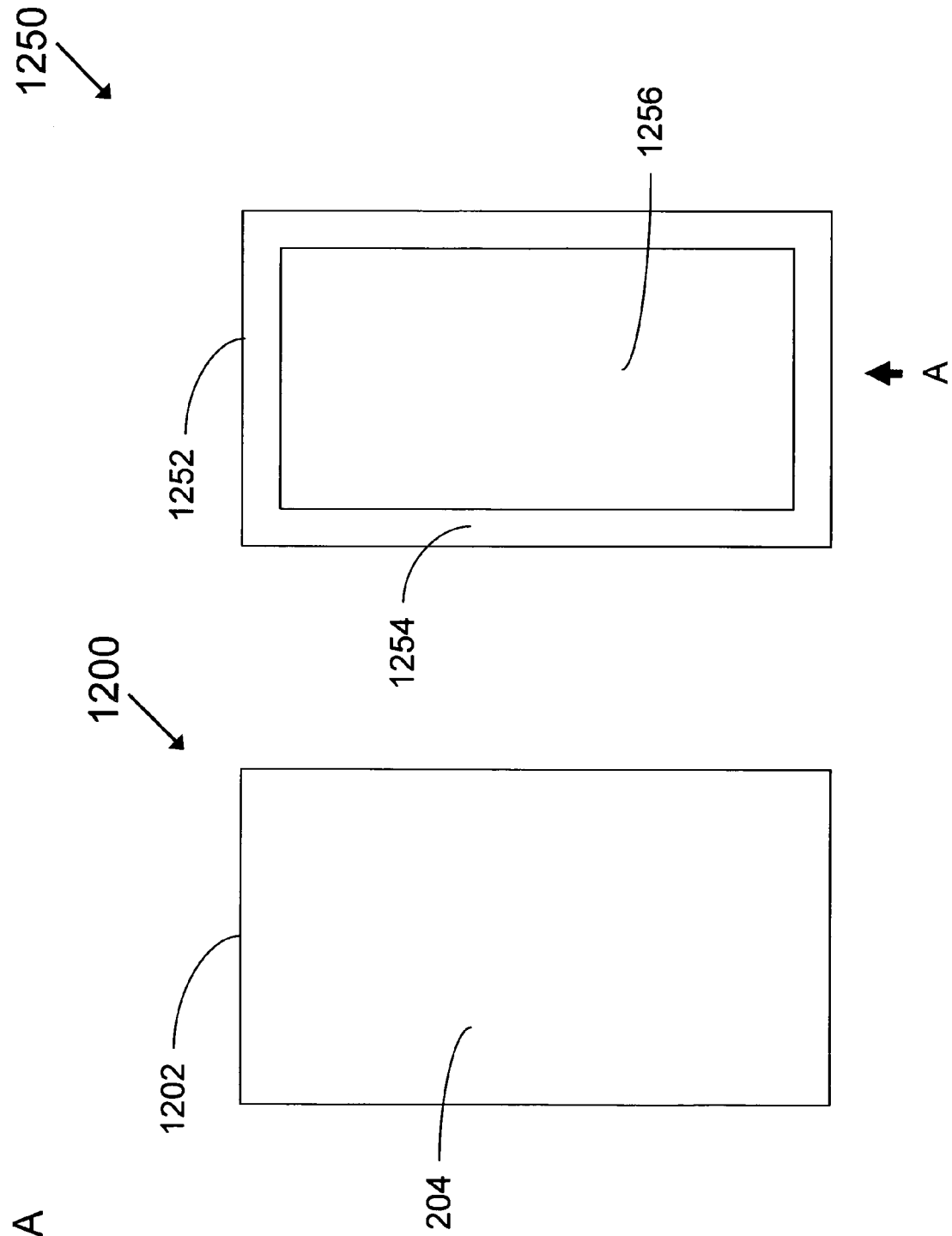

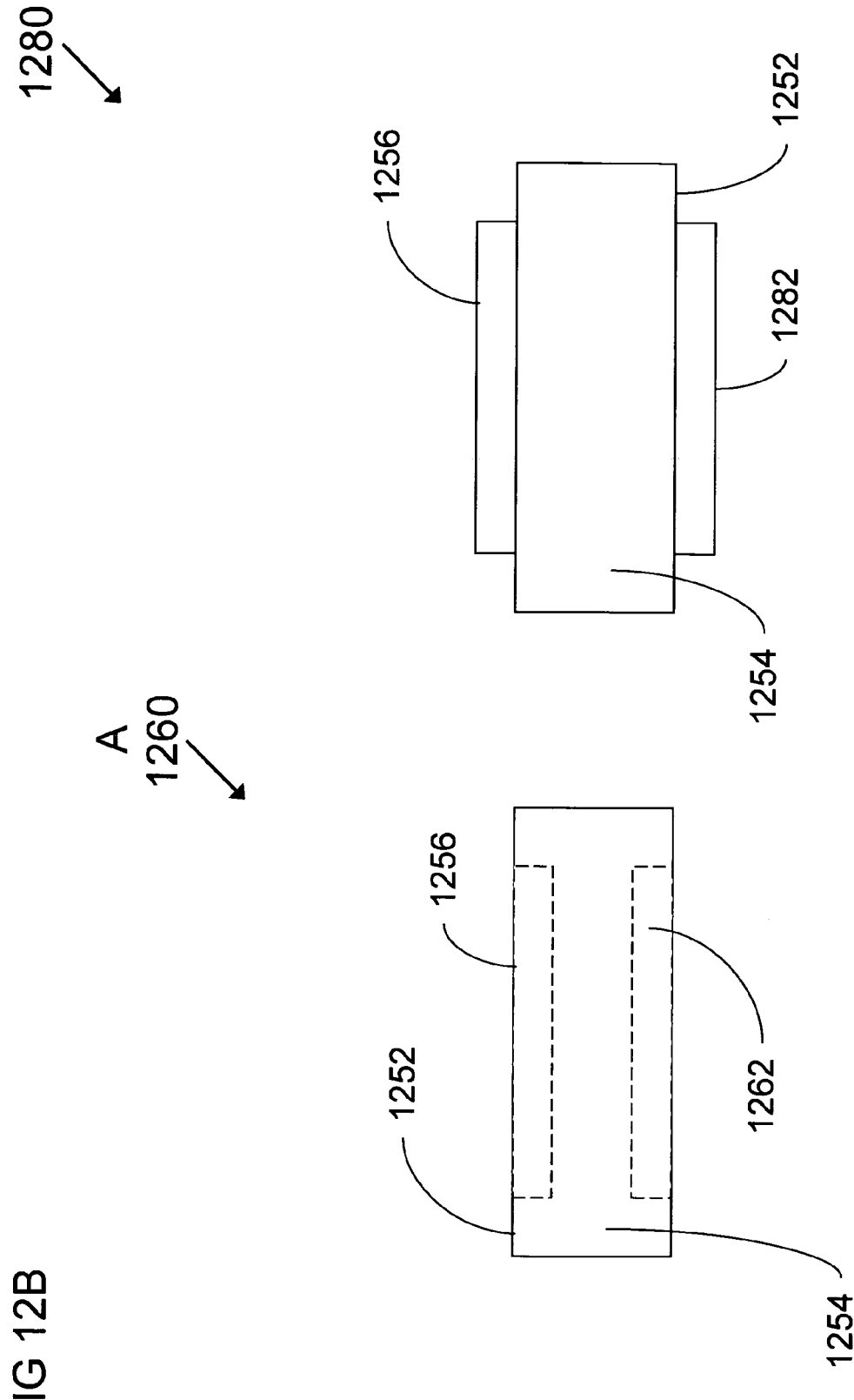

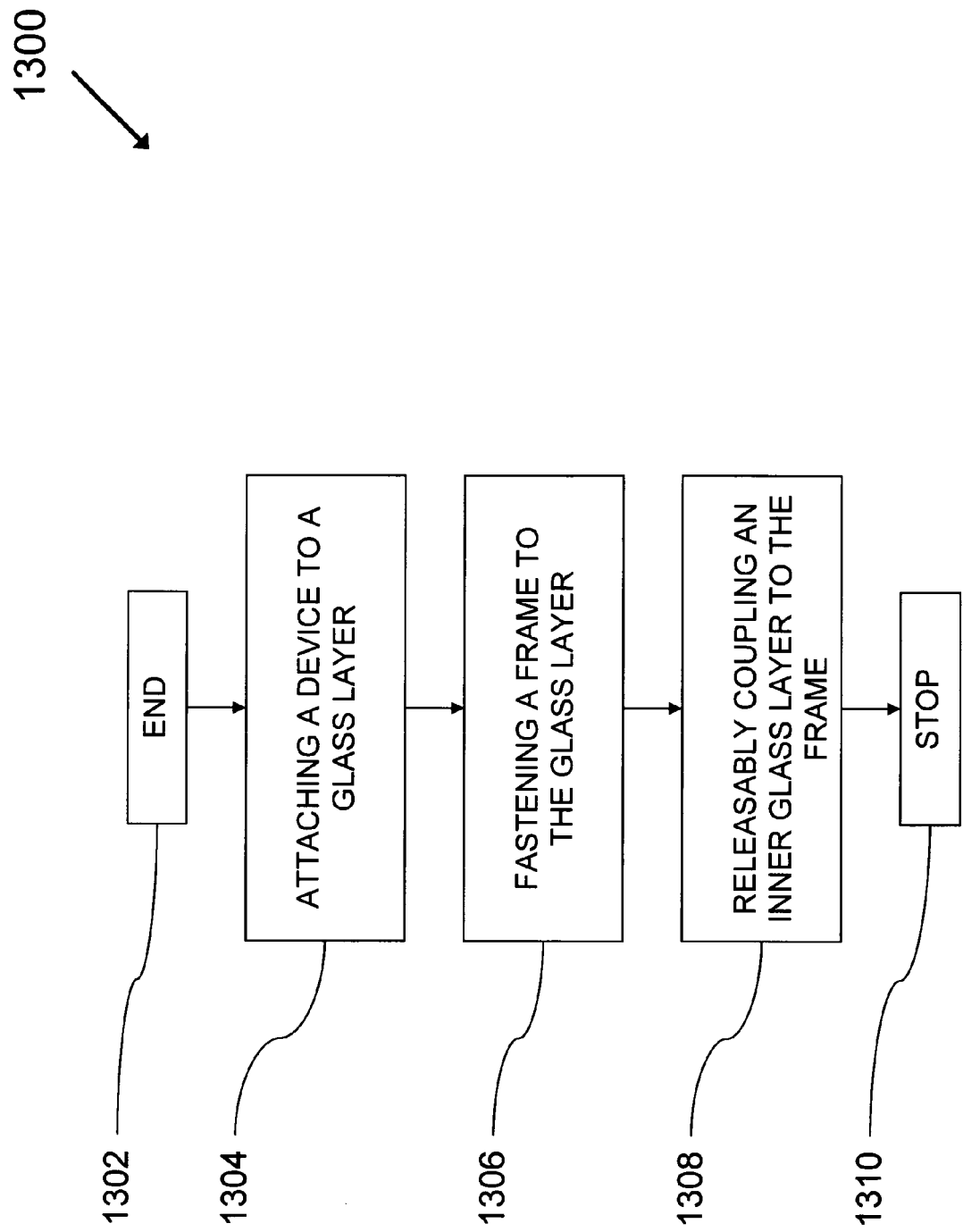

APPARATUSES AND METHODS FOR COMBINING MIRRORS WITH ELECTRONICS IN MEDICINE CABINETS

RELATED APPLICATIONS

This patent application claims priority from U.S. Provisional Patent Application Ser. No. 61/395898 filed on May, 18, 2010 titled "APPARATUSES AND METHODS FOR COMBINING MIRRORS WITH ELECTRONICS" and is hereby incorporated by reference into the present application.

BACKGROUND OF THE INVENTION

1. Field of Invention

The invention relates generally to mirrors, and more specifically to combining mirrors with electronics in medicine cabinets.

2. Art Background

Mirrors are used in various rooms of a dwelling such as in any room of a home, or in a hotel room, such as a bath room, living room, bed room, etc. Often, when a mirror is used indoors, light is needed to adequately illuminate the person using the mirror. Light requires energy, and when lights are left on after a person uses a mirror energy is wasted. This can present a problem.

When backlight is used to illuminate a person who is looking into a mirror, it is desirable to provide soft and uniform light since the person will be looking in the direction of the light in order to use the mirror. A light that is too bright could strain and/or damage the person's eyes. Such a light can waste energy by providing more light than is necessary to illuminate the person using the mirror. This can present a problem.

Modern life can present time pressure for people. Often requiring a person to multitask. Examples of multitasking are trying to receive information while spending time in a bathroom while preparing for the day. Electronic presentation of information is not available in the bathroom. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 5 illustrates an interior view of a medicine cabinet, according to embodiments of the invention.

FIG. 12A illustrates configurations of mirrors and frames utilizing releasable couplers, according to embodiments of the invention.

FIG. 12B illustrates mounting configurations between glass layer and frame, in end view from FIG. 12A, according to embodiments of the invention.

FIG. 13 illustrates a method of utilizing a releasable coupler, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for incorporating electronic devices into a medicine cabinet. In one or more embodiments, an information display, backlighting, transducers, defoggers, and controls are incorporated into a medicine cabinet door. Relative proportions of elements should not be inferred from the figures that follow. Elements are shown either larger or smaller than actual size to facilitate clarity of illustration. No absolute or relative size information should be inferred therefrom.

Figure 1:
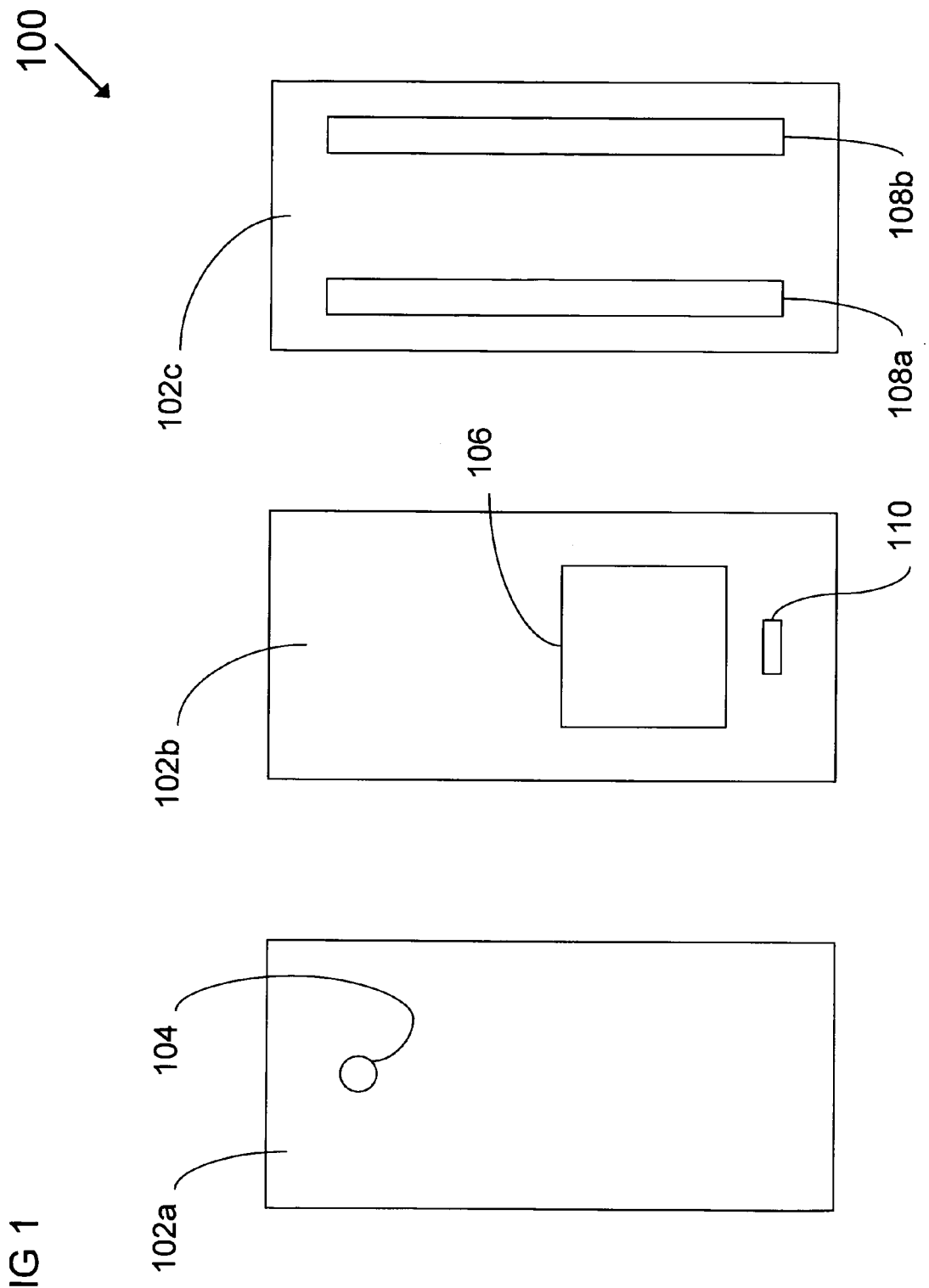
FIG. 1 illustrates various combinations of electronic devices with glass layers according to embodiments of the invention.

FIG. 1 illustrates various combinations of electronic devices with glass layers, generally at 100, according to embodiments of the invention. With reference to FIG. 1, a back side of a glass layer 102a is shown. The glass layer 102a is used in a medicine cabinet door and can be referred to interchangeably as a glass layer or an outer glass layer. One form of electronic device, a transducer 104 is attached to the glass layer 102a. The transducer 104 is any one of a number of transducers that will impart a vibrational excitation to the glass layer 102a. For example, a piezoelectric transducer, a moving coil transducer, etc. In one non-limiting example, a transducer such as an NXT-HK-PSS-0088-4 ohm acoustic exciter from Hi Wave Technology is used. Signals are fed to the transducer 104 via wires (not shown) to provide an input that results in a vibration imparted to the glass layer 102a by the transducer 104. The glass layer 102a moves in response to the vibration imparted by the transducer 104 which causes sound waves to be generated in the vicinity of the glass layer 102a. A person in the vicinity of the glass layer 102a can hear the sounds generated thereby. Alternatively, a transducer such as an acoustic speaker can be used to transmit sound. One or more apertures can be located in the medicine cabinet door to facilitate coupling of sound energy from the interior of the medicine cabinet to the exterior.

A back side of another glass layer 102b is shown and is illustrated with another form of electronic device attached thereto, an information display 106. The information display 106 can be in various embodiments an information display used to display video signals to a person viewing the information display from a font side of the glass layer 102b. The information display 106 can be referred to by various terms, by those knowledgeable in the art as; a media display panel, a flat panel, a liquid crystal display (LCD), a plasma display, a display, a TV, etc. No limitation is implied by the use of the term used to refer to the information display. In some instances, an information display contains all of the components to provide a standalone television, e.g., TV tuner, power supply, inverter, etc. In other instances, the information display is just the panel on which video information is displayed, minus power supply, etc. In some embodiments the information display provides an image appearing to have a three-dimensional quality (3D).

Signals are sent to the information display from a variety of sources such as from a television tuner, a video play back device, streaming video over the Internet, a smart phone, a tablet computer, a laptop computer, etc. Medicine cabinets incorporating information displays according to the teachings of embodiments contained herein are used in a variety of places. A non-limiting list of such places includes but is not limited to hotels, public bathrooms, and private bath rooms.

A control 110 is illustrated on the glass layer 102b. The control 110 is used to operate various electronic devices that are incorporated into the medicine cabinet door. The control 110 is typically connected to an electronic device such as 104, 106, 108a and 108b via wires (not shown) and can be operated by a user wirelessly from a front side of the glass layer. The control 110 can be, for example, a wireless control used to control the flat panel. In one embodiment, the control 110 is an IR control utilizing wireless communication in the infrared spectrum. In some embodiments, the control 110 is a capacitive touch control, which responds to a user's touch. Such a control is described in a United States Patent Application filed concurrently having client matter number 101404.P004, which is hereby incorporated by reference. In another embodiment, a smart phone is used to download an application that runs on the user's smart phone and uses the phones wireless functionality to control the media display device including streaming video and audio to the information display.

A backside of another glass layer 102c is illustrated with backlight assemblies 108a, and 108b. Backlight assemblies 108a, and 108b are described more fully below in conjunction with FIG. 6 through FIG. 9. Backlight assemblies, in general, provide a source of scattered light to a front side of a glass layer so that a user can see her or himself in the front side of the glass layer that is prepared as a mirror for viewing reflections thereon.

In various embodiments, the control 110 is provided on any of the glass layers 102a, 102b, and 102c for use with various electronic devices.

Figure 2:
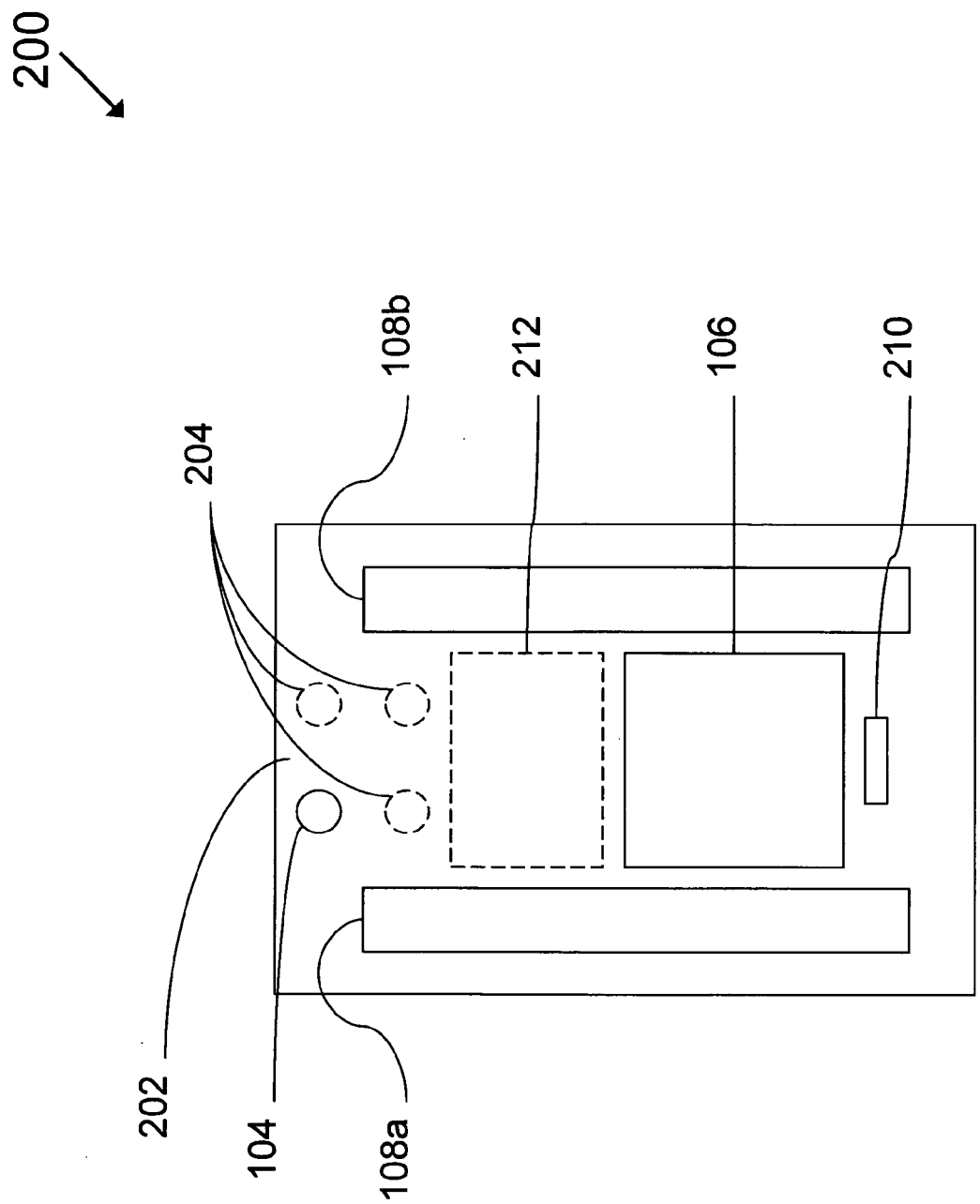
FIG. 2 illustrates a combination of electronic devices and a glass layer, according to embodiments of the invention.

FIG. 2 illustrates a combination of electronic devices and a glass layer, generally at 200, according to embodiments of the invention. With reference to FIG. 2, the transducer 104 is shown attached to a back side of a glass layer 202. Additional optional transducers 204 are illustrated. One or more transducers are utilized to provide an acceptable level of sound volume to a user sanding in the vicinity of a front side of the glass layer 202. An information display 106 is attached to the back side of the glass layer 202. The backlight assemblies 108a and 108b are attached to the backside of the glass layer 202. An optional mirror defogger 212 is attached to the backside of the glass layer 202 as shown in FIG. 2. Alternatively, the mirror defogger 212 can be held in place with a frame. Thus, in many configurations various electronic devices are combined with a medicine cabinet, a non-limiting list of electronic devices includes but is not limited to transducers (including speakers), information displays, lighting, controls, defoggers, clocks, etc.

A control 210 is attached to the backside of the glass layer 202. The control 210 is configured as needed to permit a user to control of the electronic devices that are present in a given embodiment.

Figure 3:
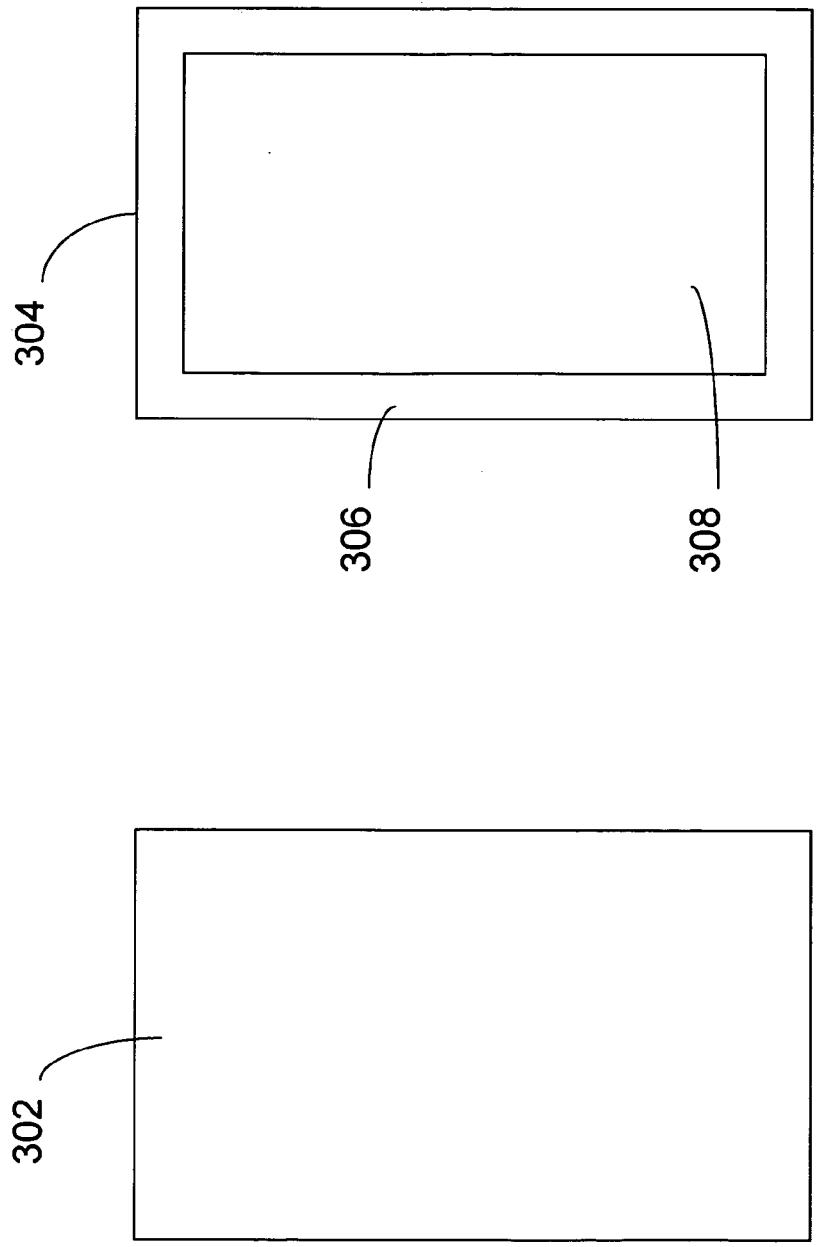
FIG. 3 illustrates glass layers attached to frames, according to embodiments of the invention.

FIG. 3 illustrates glass layers attached to frames, generally at 300, according to embodiments of the invention. With reference to FIG. 3, a front side of a glass layer 302 is shown mounted to a frame to form a medicine cabinet door. The frame is not visible because the frame is located behind the glass layer 302 out of view from the front side, which is illustrated in FIG. 3. Typically, when a backlight assembly is incorporated into a medicine cabinet door, the glass layer 302 has at least one reflective area that reflects light and one area that scatters light; however the area that scatters light is not shown on 302 for simplicity of illustration.

An alternative arrangement of a medicine cabinet door 304 is shown with a glass layer 308 and a frame 306. In this arrangement, the frame 306 is visible around the glass layer 308. Glass layer 308 will usually have an area that reflects light and optionally an area that scatters light. In some embodiments, all of the glass layer 308 or 302 will reflect light.

Figure 4:
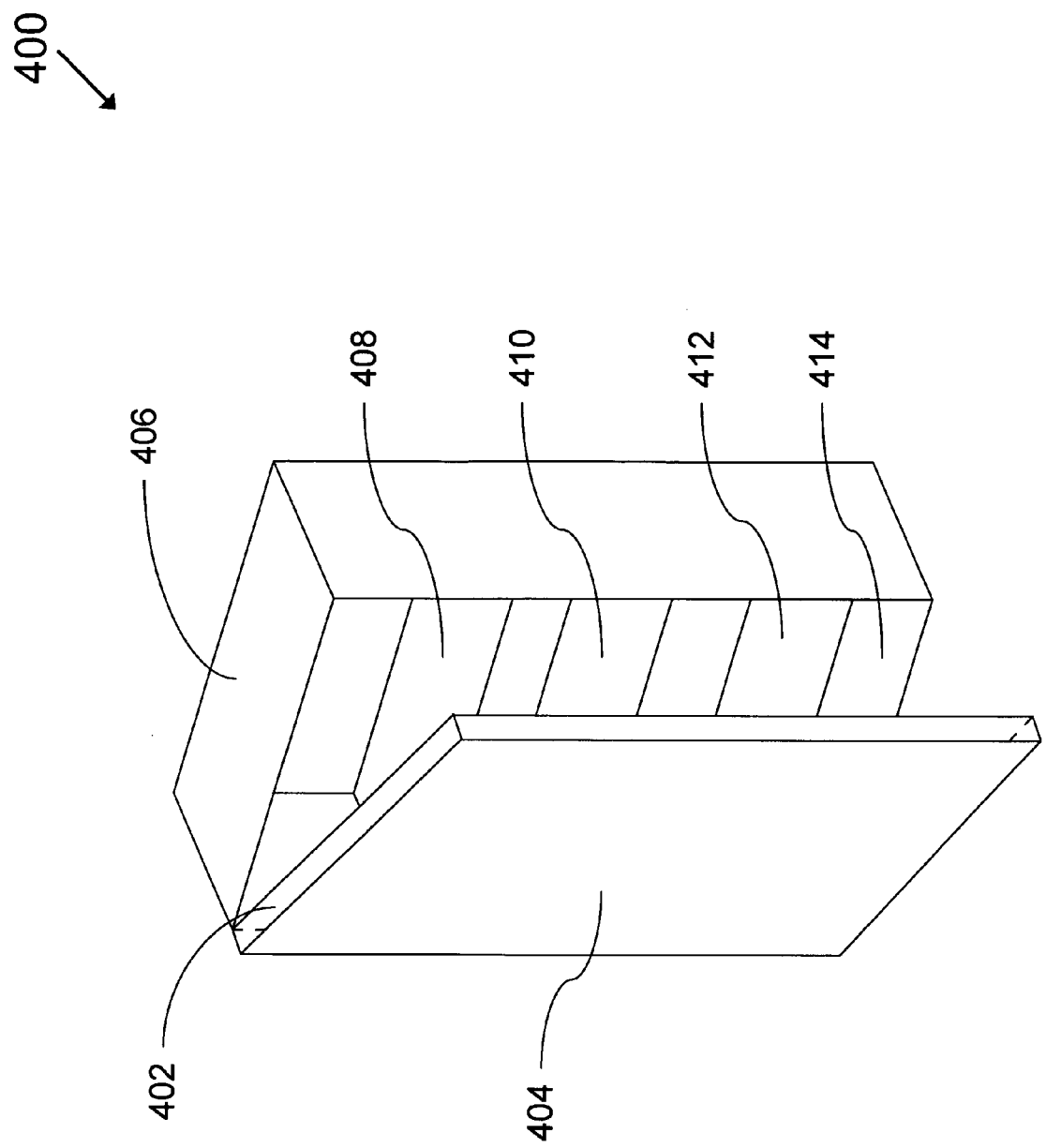
FIG. 4 illustrates a perspective view of a medicine cabinet, according to embodiments of the invention.

FIG. 4 illustrates a perspective view of a medicine cabinet, generally at 400, according to embodiments of the invention. With reference to FIG. 4, a medicine cabinet 400 has a cabinet 406 and a medicine cabinet door 402. The medicine cabinet door has an outer glass layer 404. The cabinet 406 has a number of shelves. In one non-limiting example, three shelves are shown in FIG. 4, a shelf 408, a shelf 410, and a shelf 412. A compartment 414 is provided in the cabinet 406. The compartment 414 contains various electronic components that are used to support the operation and functionality of the electronic devices that are mounted in a medicine cabinet door, such as the medicine cabinet door 404. Power outlets can also be provided in the medicine cabinet such as outlets for direct current (DC) or alternating current (AC). In some configurations a ground fault interrupter (GFI) will be provided on the medicine cabinet.

FIG. 5 illustrates an interior view of a medicine cabinet, generally at 500, according to embodiments of the invention.

In various embodiments, the medicine cabinet door is made to be thin, typically less that 1.5 inch and often is less than 0.875 inch. Depending on the type of information display used, it may be advantageous to house some of the associated electronics in the compartment 414 of the cabinet 404. In some embodiments, the information display is a display used in conjunction with a television (TV) tuner in order to provide television programming for a user to view on an information display incorporated into a medicine cabinet door. In appropriate embodiments, such a configuration can be illustrated in 100 (FIG. 1), 200 (FIG. 2), 300 (FIGS. 3), and 400 (FIG. 4).

In some embodiments, a media display panel, an associated inverter board, and infrared (IR) receiver are mounted in the medicine cabinet door. In other embodiments, a drive for an LED lit panel can be included in the medicine cabinet door. In some embodiments, some of the media display electronic components such as a television receiver 502, with optional command data protocol translator, etc. are placed in the compartment 414. A power supply 506 can be placed in the compartment 414, which can provide power to any part of the media display system. An optional TV inverter board 510 can be located in the compartment 414 or the TV inverter can be located with the information display in the medicine cabinet door.

Additionally, electrical components that support the functionality of the medicine cabinet door lighting can be located in the compartment 414. For example, a light element driver 504, a dimmer 508, etc., can be incorporated into the medicine cabinet 406.

Note that for clarity in the illustrations, wiring between components and from the medicine cabinet door to the cabinet have been omitted for clarity in the illustrations. Those of skill in the art will note that interconnecting wires between components are necessary as are appropriate wiring between the medicine cabinet and the medicine cabinet door.

Figure 6A:
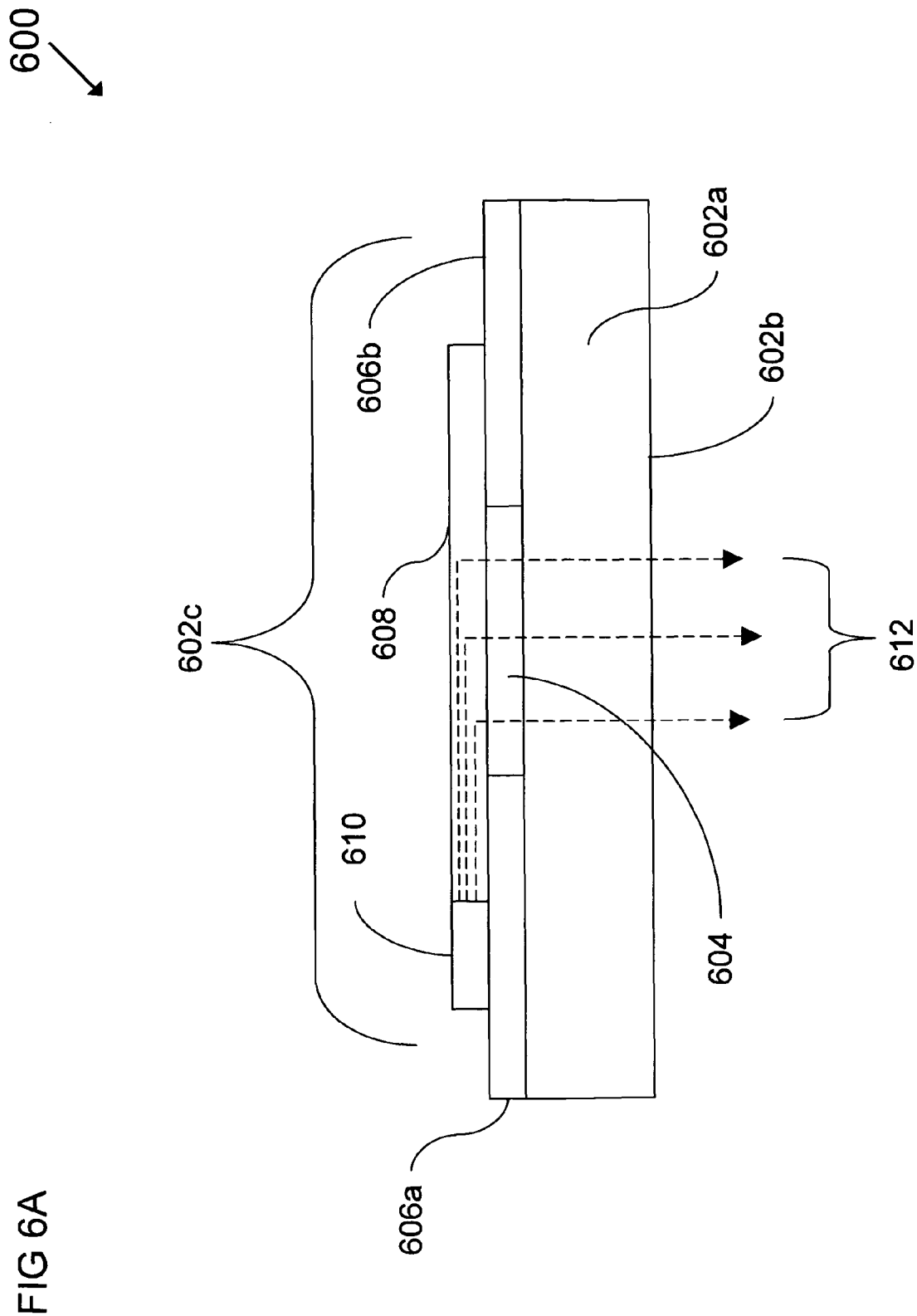
FIG. 6A illustrates a device for providing backlight, according to embodiments of the invention.

FIG. 6A illustrates a device for providing backlight, generally at 600, according to embodiments of the invention. With reference to FIG. 6A, a glass layer 602a has a front side 602b and a back side generally indicated at 602c. The backside 602c of the glass layer 602a is prepared into several areas. A first area, indicated at 604 scatters light and a second area, indicated at 606a and 606b reflects light. 604, 606a, and 606b extend into the plane of FIG. 6A to form an area having units of length squared, e.g., square inches, square centimeter, etc. Light incident upon the front side of the glass layer 602b will be reflected from the second area 606a and 606b, thereby providing a mirror to a user who views the glass layer from the front side 602b. A reflective coating has been applied to the second area 606a and 606b to make it reflective. One non-limiting example of a reflective coating is a coating made from silver paint.

The first area 604 scatters light and extends into the plane of the figure as described above. In one non-limiting example, the first area is rectangular as shown in 652 or 654 in FIG. 6B. The first area 652 or 654 can be formed into any desired shape. With reference back to FIG. 6A, the back side surface of the glass 602a coincident with the first area 604 can be prepared in a variety of ways to produce the desired scattering of light incident thereon. For example, the first area 604 can be sandblasted, acid etched, etc. to produce the desired scattering. A diffuser 608 is shaped to cover the first area. The diffuser 608 will have an area similar to the first area but usually slightly larger to provide a uniform illumination of light when viewed from the front side; therefore if the first area is rectangular the diffuser will be rectangular. This is done to conserve material and to permit a light source to be positioned close to the edge of the first area 604. In one embodiment, acrylic sheet is used for the diffuser material. In one or more embodiments ACRYLITE® EndLighten acrylic sheet from EVONIK Industries is used for the diffuser material. A layer of paint applied over the first area 604 can also be used for the diffuser material.

A light source 610 is positioned on the backside 602c of the glass layer and next to the diffuser 608. The light source emits light which enters the diffuser 608 and leaves through the scattering area 604 as indicated at 612. The light 612 illuminates a user who views her or himself from the front side 602b.

In various embodiments, the light source 610 is a distributed light source emitting light along the length of the diffuser 608. In one or more embodiments, the light source 610 is made from an array of light emitting diodes (LEDs). Alternatively, a distributed light source is made from a fluorescent light tube that extends along the diffuser 608. In yet other embodiments, the distributed light source is made from an array of incandescent light bulbs. The devices for providing backlight described herein provide light sufficient for a user of the medicine cabinet to see his or her reflection in the reflective portion of the glass layer (mirror) while standing in front of the medicine cabinet. The intensity of the light sources can be sized to provide enough illumination for the user to see his or her reflection without supplemental lighting.

Figure 6B:
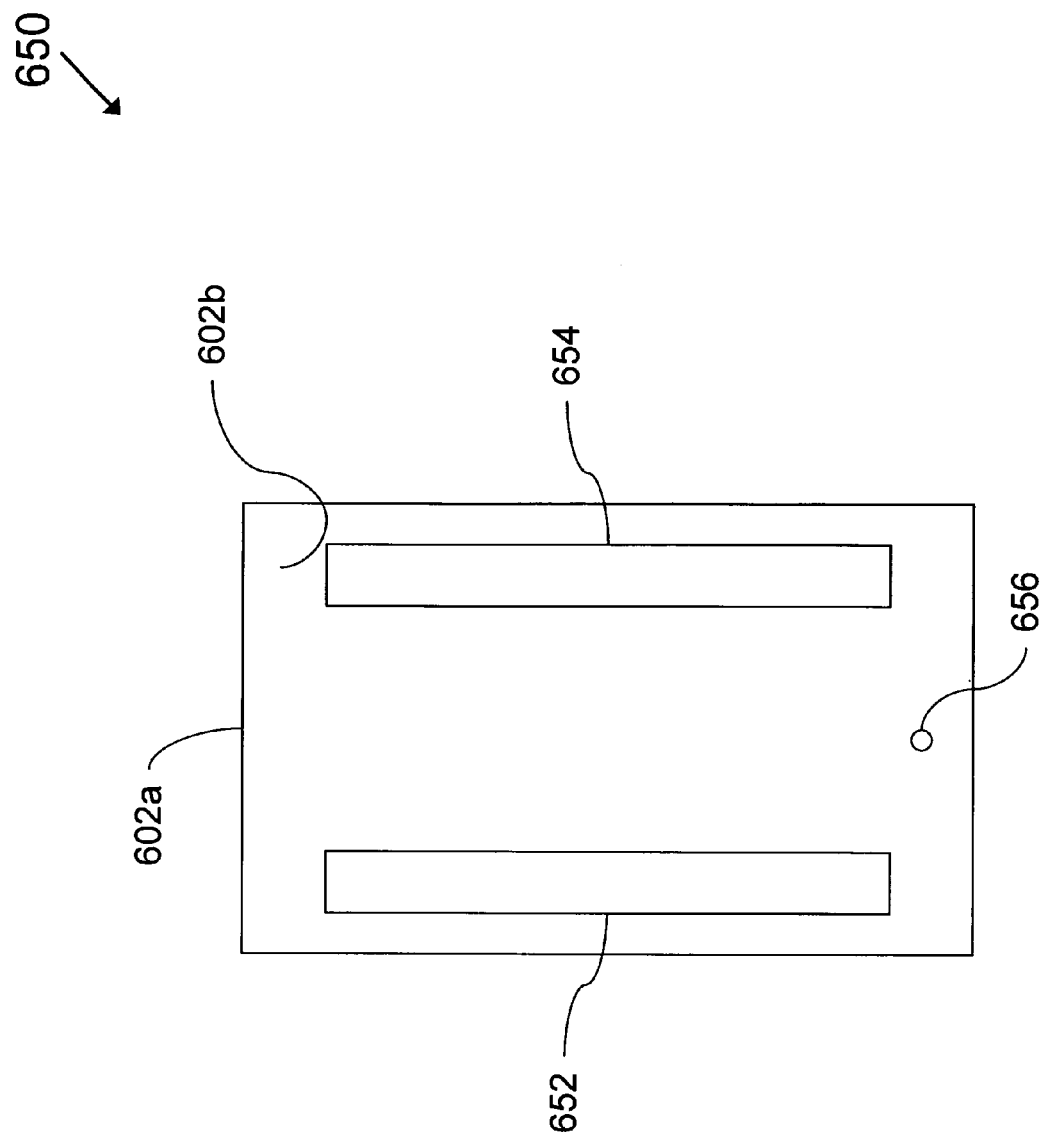
FIG. 6B illustrates a front view of a glass layer with backlight, according to embodiments of the invention.

FIG. 6B illustrates a front view of a glass layer with backlight, generally at 650, according to embodiments of the invention. With reference to FIG. 6B, a scattering area 652 and 654 are provided on the glass layer 602b. The shape of the scattering areas is rectangular; however the scattering areas can be configured into any shape.

In some embodiments, when a wireless control system is used to control electronic devices contained in the door of the medicine cabinet, it can be advantageous to remove or reduce the mirror coating as shown at 656. An infrared receiver can be located on the backside of the glass layer in the region defined by 656. Control of the electronic devices contained with the medicine cabinet door is accomplished with a hand-held transmitter as is known to those of skill in the art. Alternatively, other wireless communication technology can be employed such as wireless technology that operates at radio frequency (RF), including Bluetooth communication links.

Figure 7:
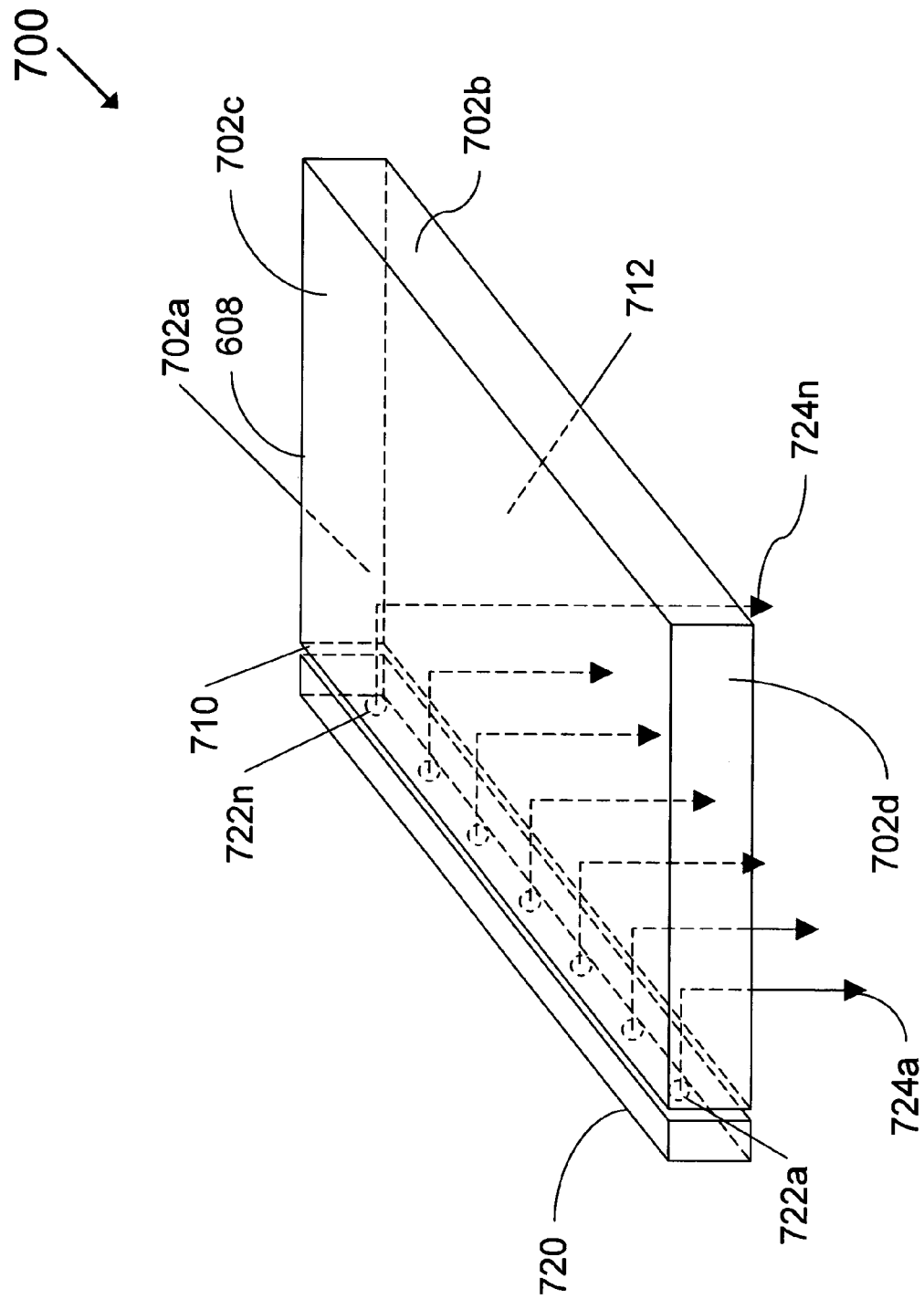
FIG. 7 illustrates a distributed light source, according to embodiments of the invention.

FIG. 7 illustrates a distributed light source, generally at 700, according to embodiments of the invention. With reference to FIG. 7, the diffuser 608 (shown in FIG. 7 in rectangular form) is illustrated in perspective view. A distributed light source 720 contains a number of discreet light elements 722a through 722n. Discreet light elements 722a through 722n emit light that enters the diffuser 608, on a surface 710, scatters within a volume of diffuser 608 or on a surface of diffuser 608, such as a surface 702a, a surface 702b, a surface 702c, and a surface 702d and is then directed out of the diffuser 608 as indicated at 724a through 724n through a surface 712 of the diffuser 608. In some embodiments, the surfaces 702a, 702b, 702c, and 702d are colored white to enhance internal reflection of light within the diffuser 608 such that light emitted from the surface 712 is maximized. Coloring the surfaces to enhance the reflection of light, such as white, silver, or another color can be accomplished in various ways such by painting, application of tape, etc.

The surface 710 can be polished to minimize reflection of light therefrom. In various embodiments, the distributed light source 720 is an array of light emitting diodes (LEDs). One non-limiting example of a distributed light source is an 8 to 10 inch length of LEDs which draws about 8.8 watts of electrical power and operates at 24 volts. In one non-limiting example, three of these LED arrays are used to provide a continuous distributed source of light that is approximately 30 inches long. Any length of light source can be created and employed in embodiments of the invention.

Figure 8:
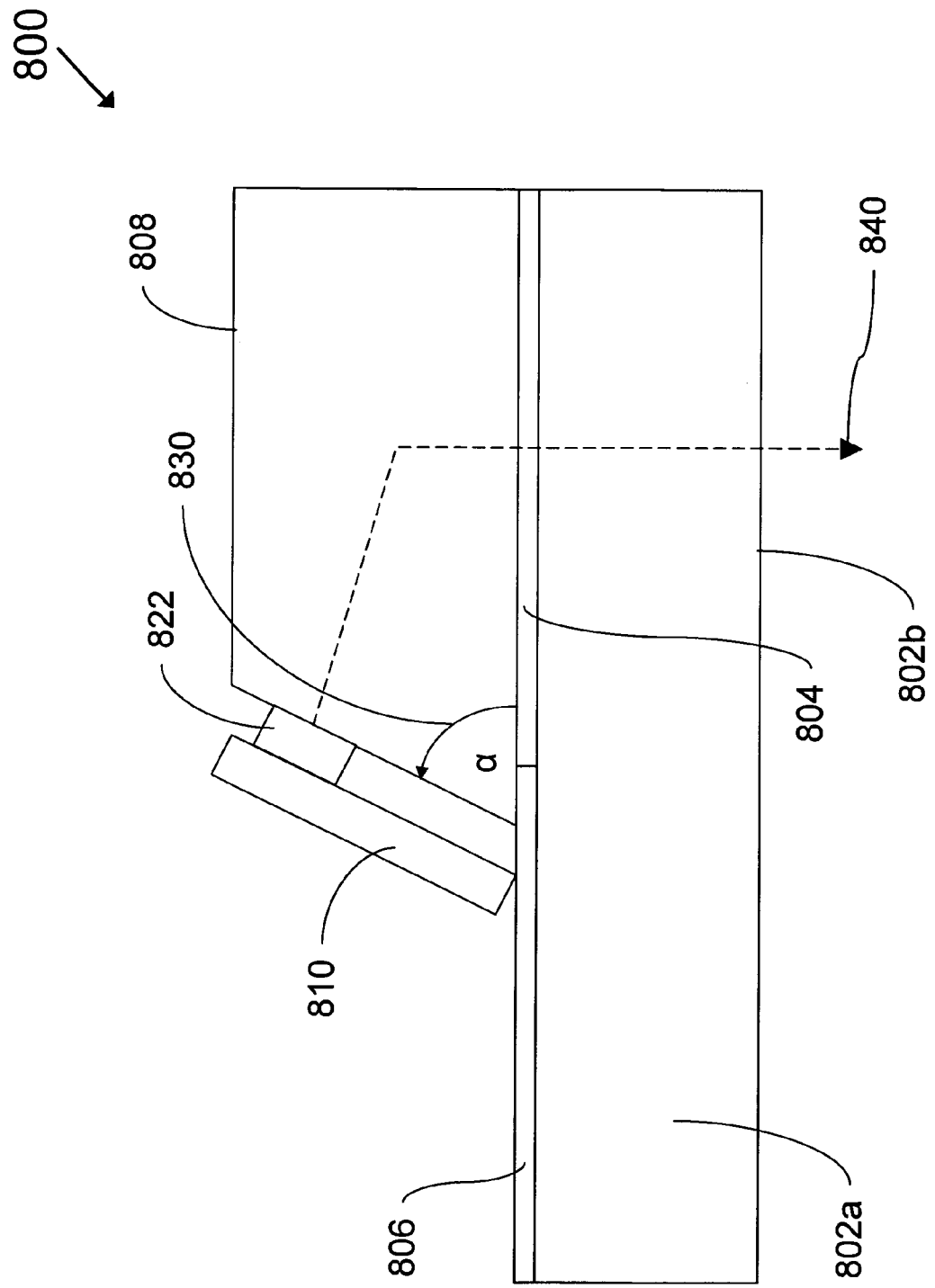
FIG. 8 illustrates mounting a light source at an angle, according to embodiments of the invention.

FIG. 8 illustrates mounting a light source at an angle, generally at 800, according to embodiments of the invention. With reference to FIG. 8, in one embodiment, an edge of a diffuser 808 is cut to an angle of approximately 50 degrees, indicated at 830. The width of the LED array 810 is often wider than the interior space that is available in a medicine cabinet door. Therefore the diffuser material is cut at an angle to facilitate packaging the LED array 810 within the low volume of the medicine cabinet door while still coupling a large amount of light from the LEDs 822 into the diffuser 808. This is done to provide a thin medicine cabinet door. Light emitted from the LEDs 822 is coupled into the diffuser 808 and passes through a glass layer 802a and out the front side of the glass layer 802b as indicated at 840. As described above, the glass layer is prepared with a first area 804 that scatters light and a second area 806 that reflects light.

In one embodiment, the diffuser 808 is made from a sheet of plastic such as acrylic sheet by cutting the angle of the edge to approximately 50 degrees. Other angles can be selected; consideration is given to the space constraints of the medicine cabinet door and the width of the area that is illuminated with the backlight assembly.

Figure 9:
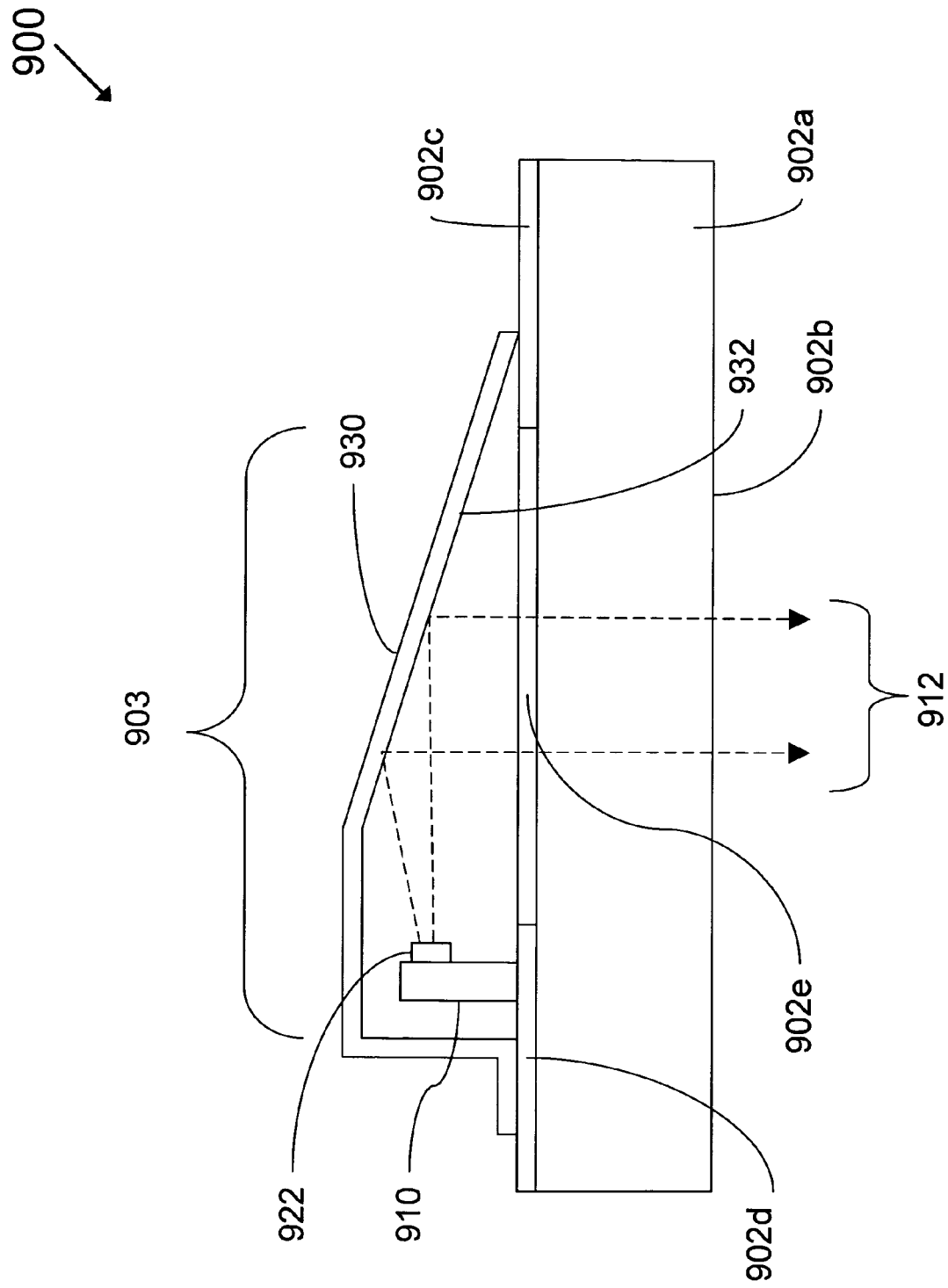
FIG. 9 illustrates another light diffuser, according to embodiments of the invention.

FIG. 9 illustrates another light diffuser, generally at 900, according to embodiments of the invention. With reference to FIG. 9, a glass layer 902a has a front side 902b and a backside indicated at 903. The glass layer 902a has a first area 902e that scatters light and a second area indicated at 902c and 902d that reflects light. A distributed light source 910 is attached to the back side 903 of the glass layer 902a. Light is emitted from a light element 922. Light element 922 can be an array of light elements extending into the plane of the figure as described above in conjunction with the preceding figures. A light reflector 930 replaces the light diffuser 608 or 808 (shown in the preceding figures) and extends into the plane of the figure as described above. The light reflector 930 is located on the back side 903 and over the first area 902e. The light reflector 930 has a reflective surface 932 that reflects light 912 out the first area 902e as indicated at 912. The light reflector 930 can be made from any material that reflects light such as metal, etc. Light 912 is visible to a user observing the front side 902b of the glass layer 902a.

Alternatively, light elements 922 can be arranged over the first area 902e to provide direct backlighting. The first area 902e scatters light. Scattering of light 912 passing through the first area 902e can be enhanced by the application of additional scattering material. A non-limiting list of additional scattering materials is a plastic film, a layer of paint, a sheet of plastic, a layer of glass, a layer of etched glass, a layer of sandblasted glass, a layer of translucent material, a custom user defined scattering layer.

Figure 10:
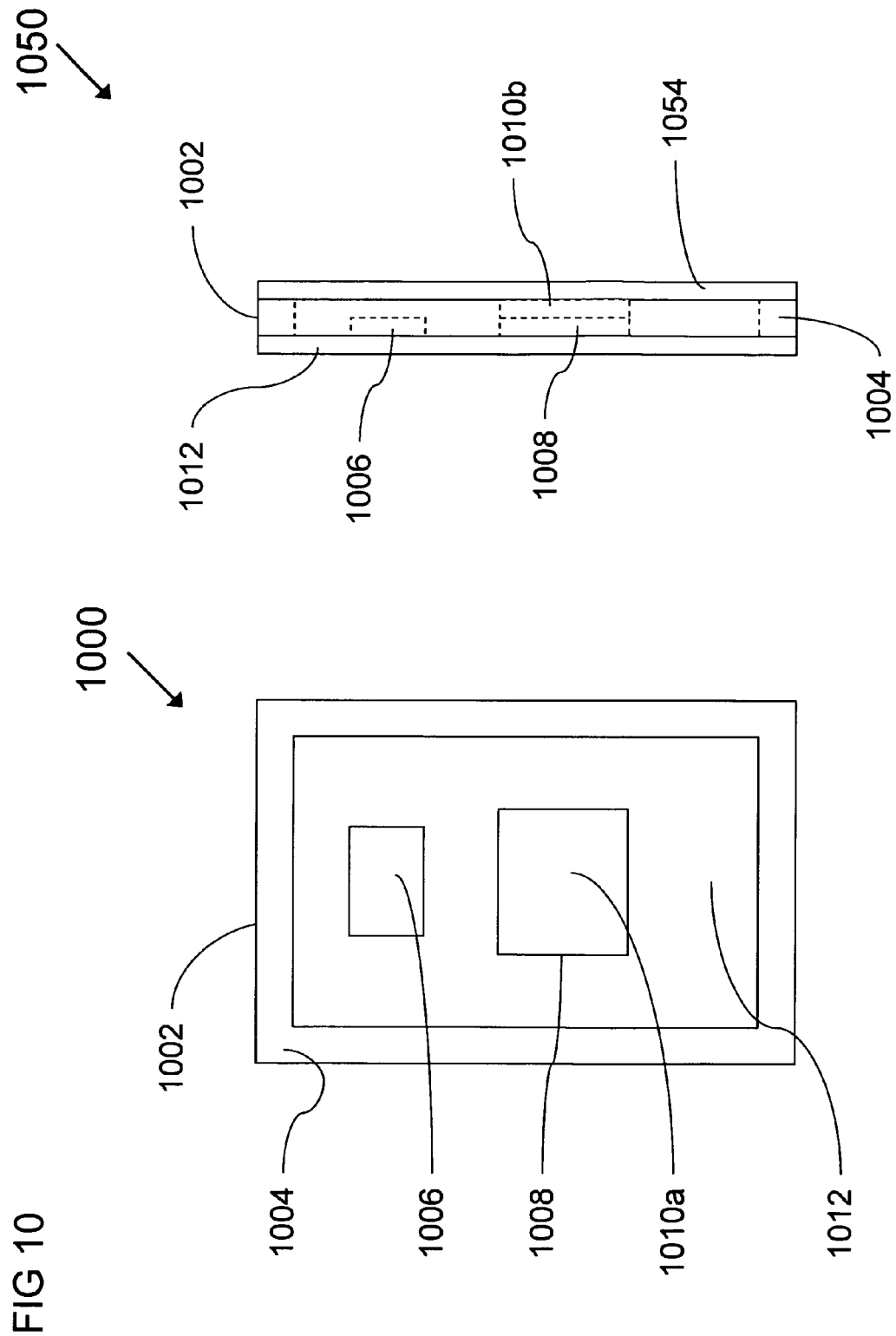
FIG. 10 illustrates a releasable coupler, according to embodiments of the invention.

FIG. 10 illustrates a releasable coupler, according to embodiments of the invention. With reference to FIG. 10, a back side view of a medicine cabinet door 1002 is shown generally at 1000. The medicine cabinet door 1002 has a frame 1004 and 1008. A back side of an outer glass layer 1012 is attached to the frame 1004 and 1008. Part of a releasable coupler 1010a engages with the part of the frame 1008. An electronic device 1006 is mounted to the outer glass layer.

The electronic device 1006 can be, in various embodiments, any of the devices discussed in the previous figures as well as other devices not discussed. Thus, 1006 represents a general electronic device attached to the back side of the outer glass layer and contained within the volume of the medicine cabinet door.

A side view of the medicine cabinet door is shown generally at 1050. In view 1050 a second part of a releasable coupler 1010b is attached to an inner glass layer 1054. Inner glass layer 1054 is held fast against the frame 1004 and 1008 by the releasable coupler 1010a/1010b. In one or more embodiments, the releasable coupler 1010a/1010b is a hook and loop capture device marketed under various trade marks such as 3M's Velcro™ brand. In one or more embodiments, a dual lock Velcro™ is used for the releasable coupler 1010a/1010b.

Figure 11:
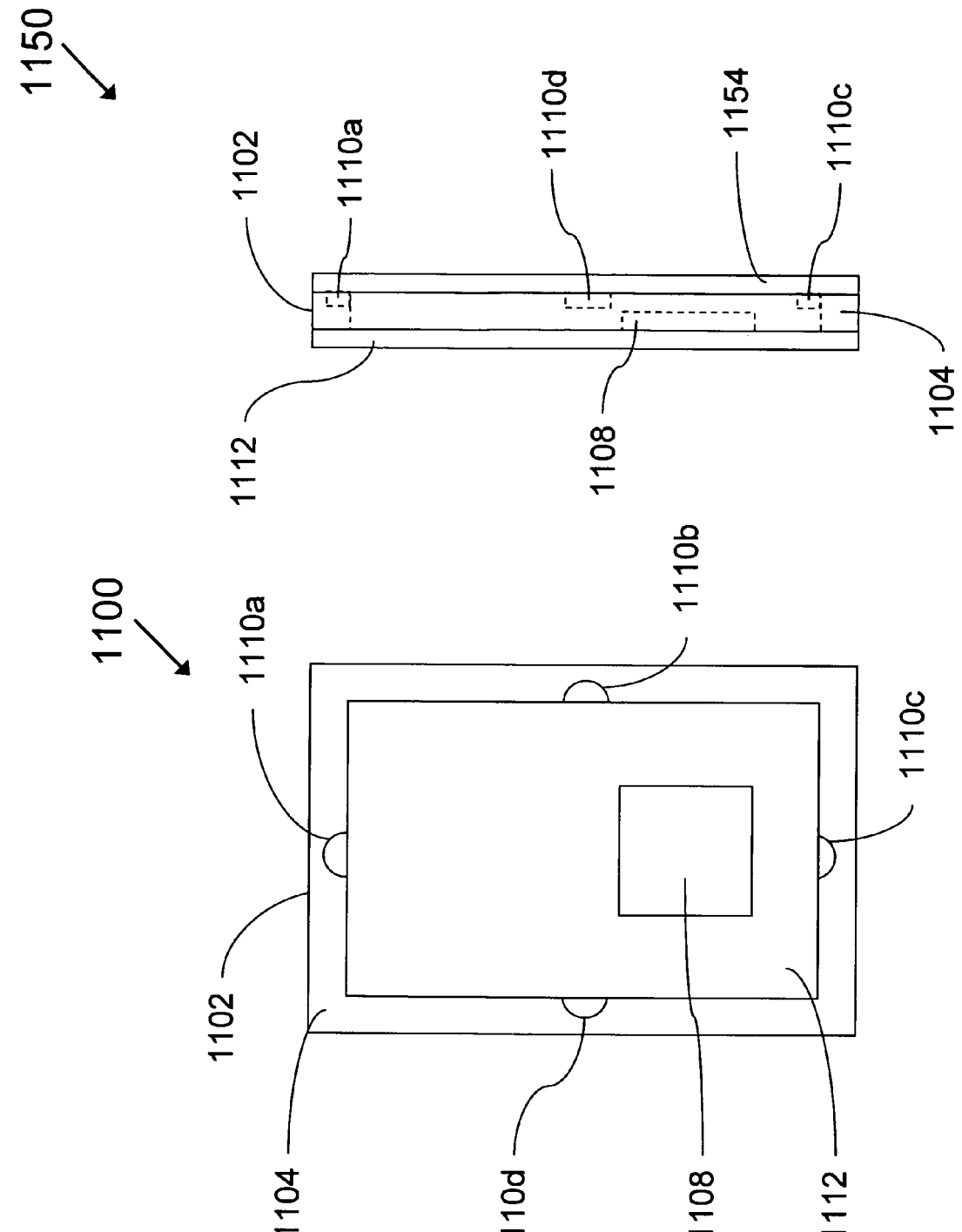
FIG. 11 illustrates a configuration of releasable couplers, according to embodiments of the invention.

FIG. 11 illustrates a configuration of releasable couplers, according to embodiments of the invention. With reference to FIG. 11, a back side view of a medicine cabinet door 1102 is shown at 1100. In this view, a frame 1104 is attached to a back side of an outer glass layer 1112. An electronic device 1108 is also attached to the back side of the outer glass layer 1112. The frame 1104 is configured with four releasable couplers attached thereto at 1110a, 1110b, 1110c, and 1110d. Any number of releasable couplers are used depending on the size of the medicine cabinet door, with consideration given to the holding force required to secure the glass layer. Pullers with suction cups are used to separate the glass layer from the rest of the medicine cabinet door.

A side view of the medicine cabinet door 1102 is shown at 1150. An inner glass layer 1154 is attached to the frame 1104 with the releasable couplers 1110a, 1110b, 1110c, and 1110d. In some embodiments, the inner glass layer 1154 provides a mirror surface for the inside of the medicine cabinet door 1102.

The medicine cabinet doors 1102 (FIGS. 10) and 1102 (FIG. 11) are attached to their respective cabinets via hinges which are not shown in order to preserve clarity of the illustration.

FIG. 12A illustrates configurations of mirrors and frames utilizing releasable couplers, according to embodiments of the invention. With reference to FIG. 12A, a front side of a medicine cabinet door 1202 is shown with an outer layer of glass 1204 attached thereto at 1200. In various embodiments, the front view of 1200 corresponds with the medicine cabinet doors shown in FIG. 10 and FIG. 11.

Another configuration of frame and outer glass layer is illustrated at 1250 in FIG. 12A. A medicine cabinet door 1252 has a frame 1254 and an outer glass layer 1256 attached thereto. The outer glass layer 1256 can either be mounted on top of the outer surface of the frame 1254 or recessed into the frame 1254 so that the glass layer is flush with the frame.

FIG. 12B illustrates mounting configurations between glass layer and frame, in end view "A" from FIG. 12A, according to embodiments of the invention. In FIG. 12B at 1260 the outer glass layer 1256 is recessed into the frame 1252. An inner glass layer 1262 is shown recessed into the frame 1254. As described previously, the inner glass layer is releasably coupled to the frame 1254.

In an alternative configuration, in FIG. 12B at 1280, the outer glass layer 1256 rests on top of the frame 1254. An inner glass layer 1282 is shown mounted to the inner surface of the frame 1254. As described previously, the inner glass layer is releasably coupled to the frame 1254.

Although both the inner glass layer 1262 and the outer glass layer 1256 have been illustrated as either recessed into the frame 1254 in view 1260 or mounted on the surface of the frame in view 1280 no limitation is implied thereby. Note that in various embodiments, an outer glass layer can be recessed and inner glass layer can be mounted on the surface of the frame. Likewise, in various embodiments, an outer glass layer can be mounted on the surface of the frame and an inner glass layer can be recessed into the frame. Alternatively, a glass layer (either inner or outer) can be partially recessed into the frame.

Construction of the medicine cabinet frames shown in the figures above typically proceeds with the attachment of an outer glass layer to a frame in a permanent or semi-permanent way typically with double sided tape, such as VHB double sided tape from 3M Company. Other tape adhesives can be used as well as other adhesives such as glue, epoxy, etc. Electronic devices are also attached to the outer glass layer using tapes, clips, etc. depending on the degree of permanence required and the particular requirements of the electronic device. The medicine cabinet door contains various electronic devices, as described above in conjunction with the preceding figures. These electronic devices require wiring connections, system testing, sometimes maintenance, and may require access at a future time. Therefore, an inside glass layer is releasably coupleable from the medicine cabinet door so that access to the electronic devices is provided upon removal of the inner glass layer.

FIG. 13 illustrates a method of utilizing a releasable coupler, generally at 1300, according to embodiments of the invention. With reference to FIG. 13, a method commences at a block 1302. At a block 1304 a device is attached to a glass layer. At a block 1306 a frame is fastened to the glass layer. At a block 1308 an inner glass layer is releasably coupled to the frame. At a block 1310 the method ends.

With reference to the method of FIG. 13, a medicine cabinet door assembly methodology is illustrated that permits disassembly and access to the internal volume of the door after construction. The rear glass (inner glass layer) can be removed to access the interior door volume. The medicine cabinet door can include lighting, such as direct or back lighting, a media display device such as an LCD or LED TV panel, inverter and IR receiver in the door, acoustic exciters, defogger, digital clock, etc.

Figure 14:
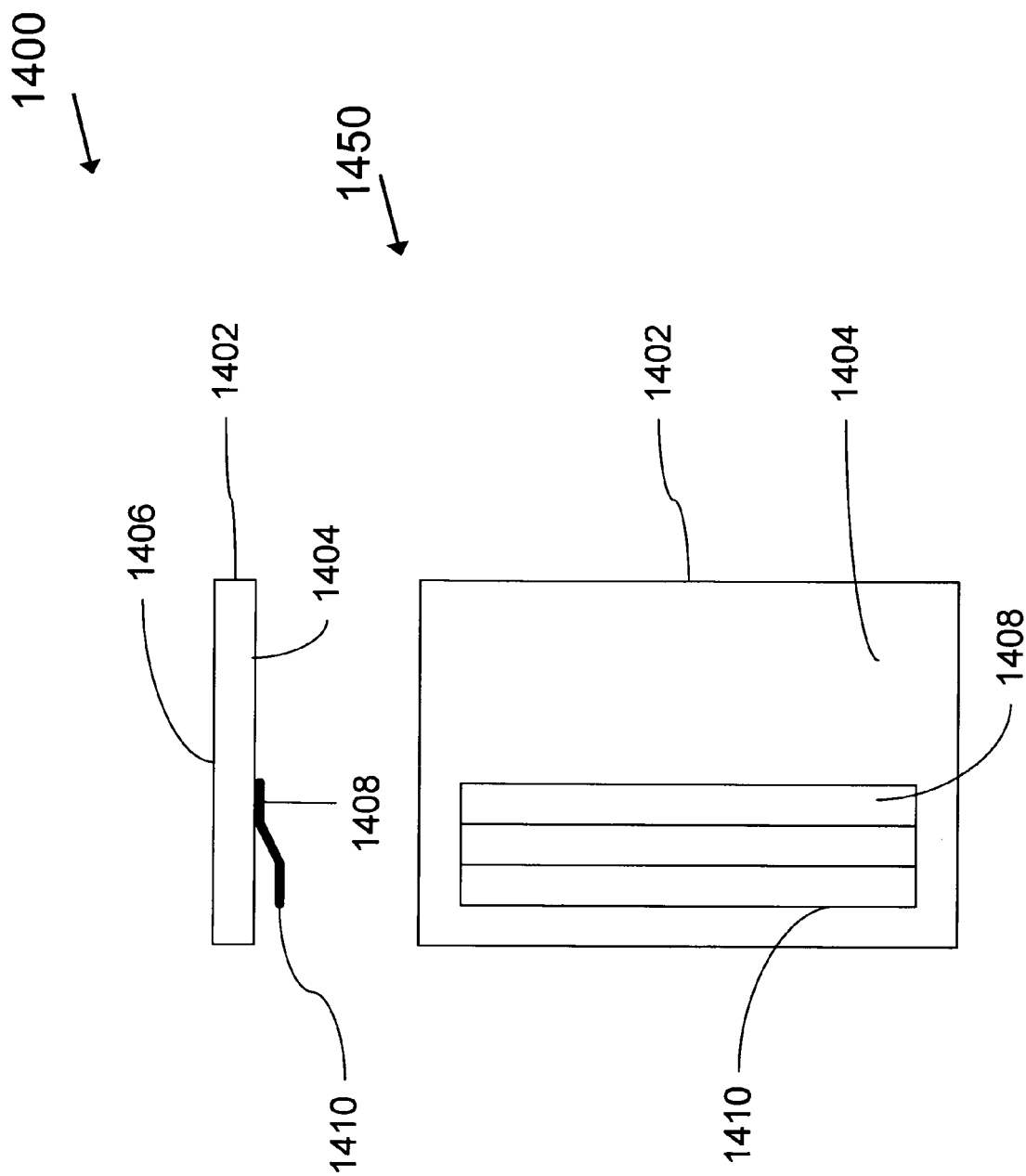
FIG. 14 illustrates a mounting strip, according to embodiments of the invention.

FIG. 14 illustrates a mounting strip, according to embodiments of the invention. With reference to FIG. 14, a back view of an outer glass layer is shown at 1450 and a top edge view is shown at 1400. An outer glass layer 1402 has a back side 1404 onto which a mounting strip 1408 is attached. The mounting strip 1408 has a raised edge 1410. A front side of the glass layer is indicated at 1406.

Figure 15:
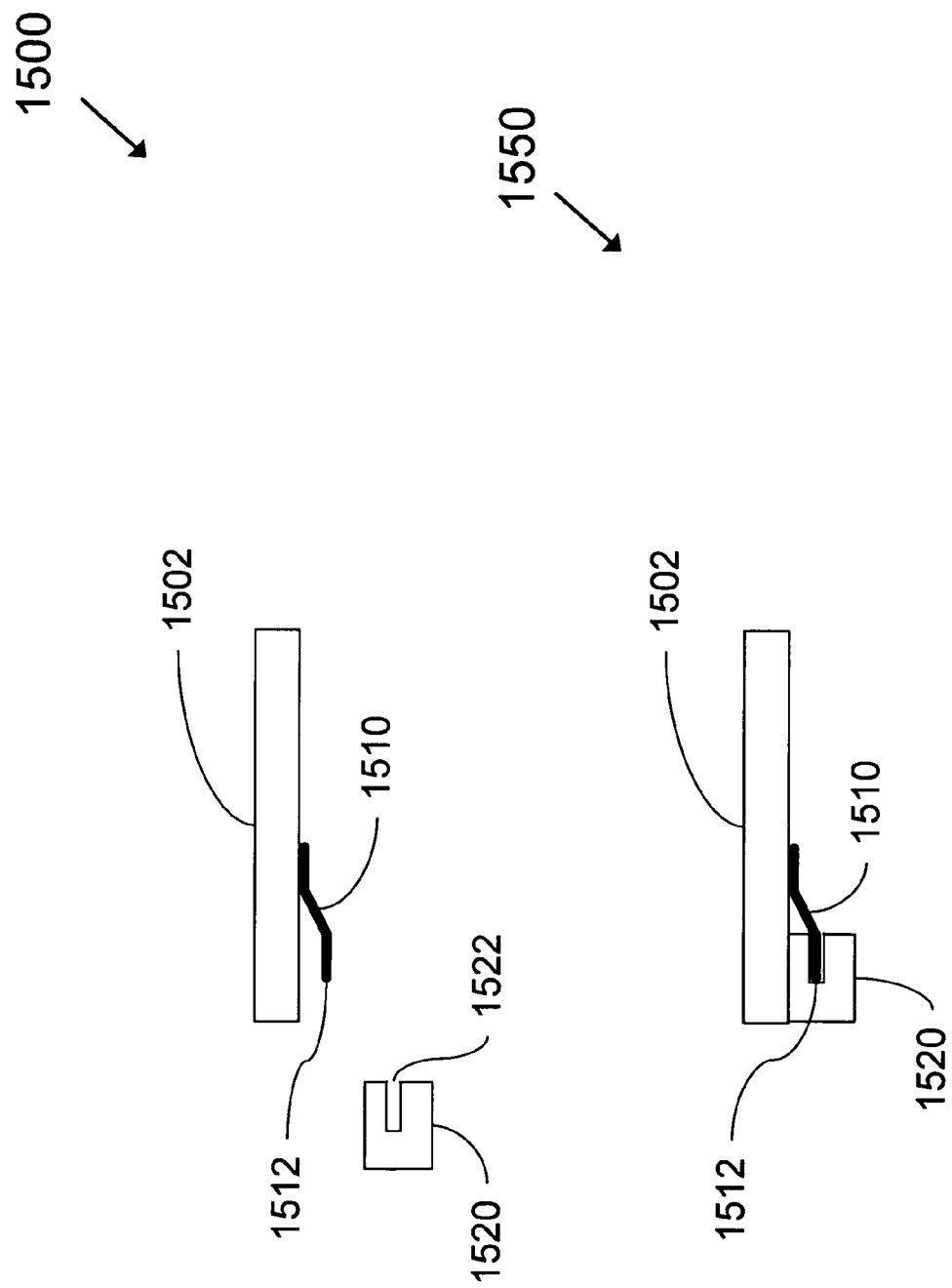
FIG. 15 illustrates a frame and mounting strip, according to embodiments of the invention.

FIG. 15 illustrates a frame and mounting strip, according to embodiments of the invention. With reference to FIG. 15, 1500 illustrates a state of disassembly and 1550 illustrates a state of assembly for a raised edge and a slot. In 1500, an outer glass layer 1502 has attached thereto a mounting strip 1510 that has a raised edge 1512. A frame 1520 has a slot 1522. The slot 1522 is sized to accept the raised edge 1512 as shown in 1550.

Figure 16:
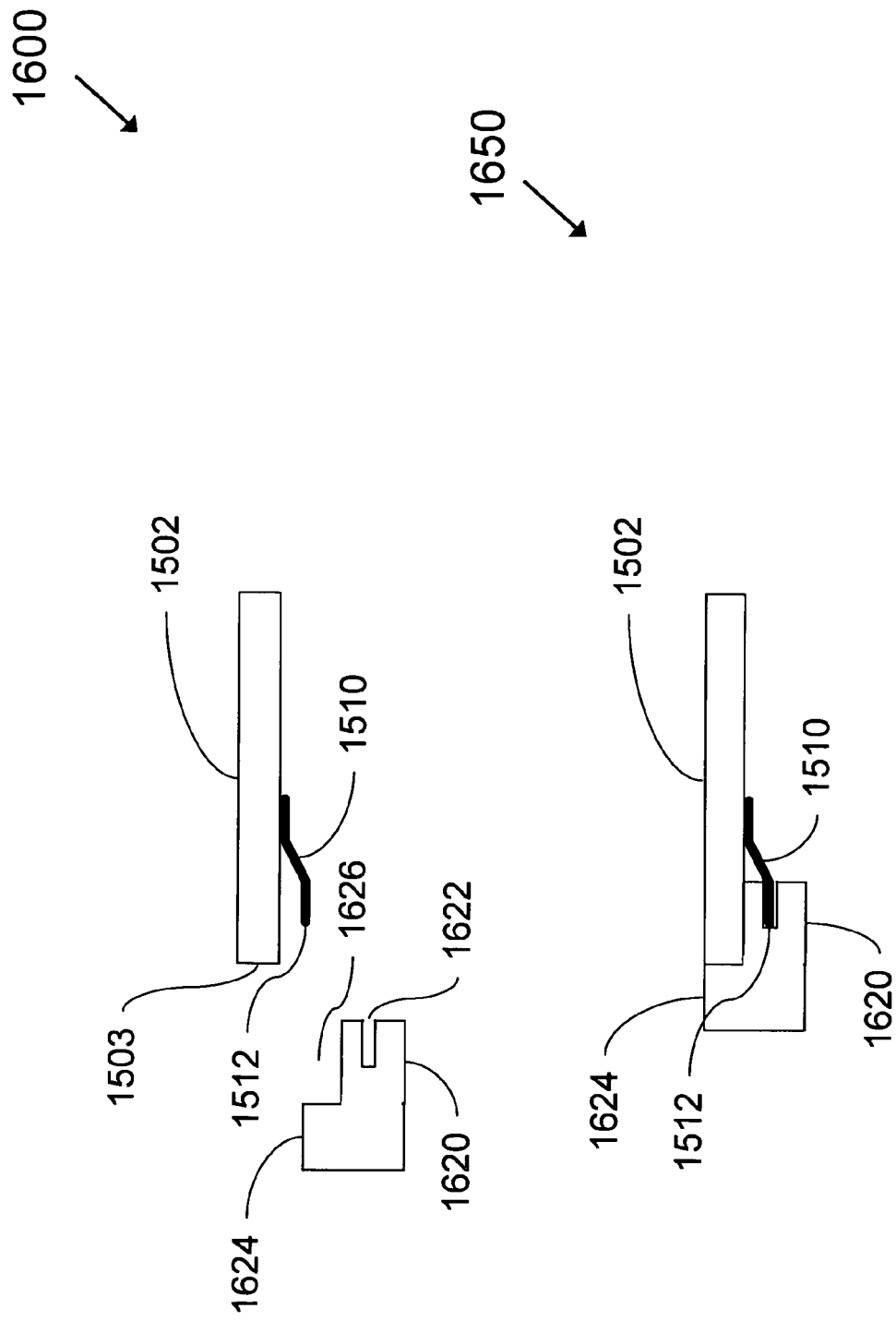
FIG. 16 illustrates another frame and mounting strip, according to embodiments of the invention.

FIG. 16 illustrates another frame and mounting strip, according to embodiments of the invention. With reference to FIG. 16, 1600 illustrates a state of disassembly and 1650 illustrates a state of assembly. A frame 1620 has a recess 1626 and a slot 1622. The recess 1626 is sized to accept the edge 1503 of the outer glass layer 1502 and a slot 1622 is sized to accept the raised edge 1512 as illustrated in assembled state 1650.

Figure 17:
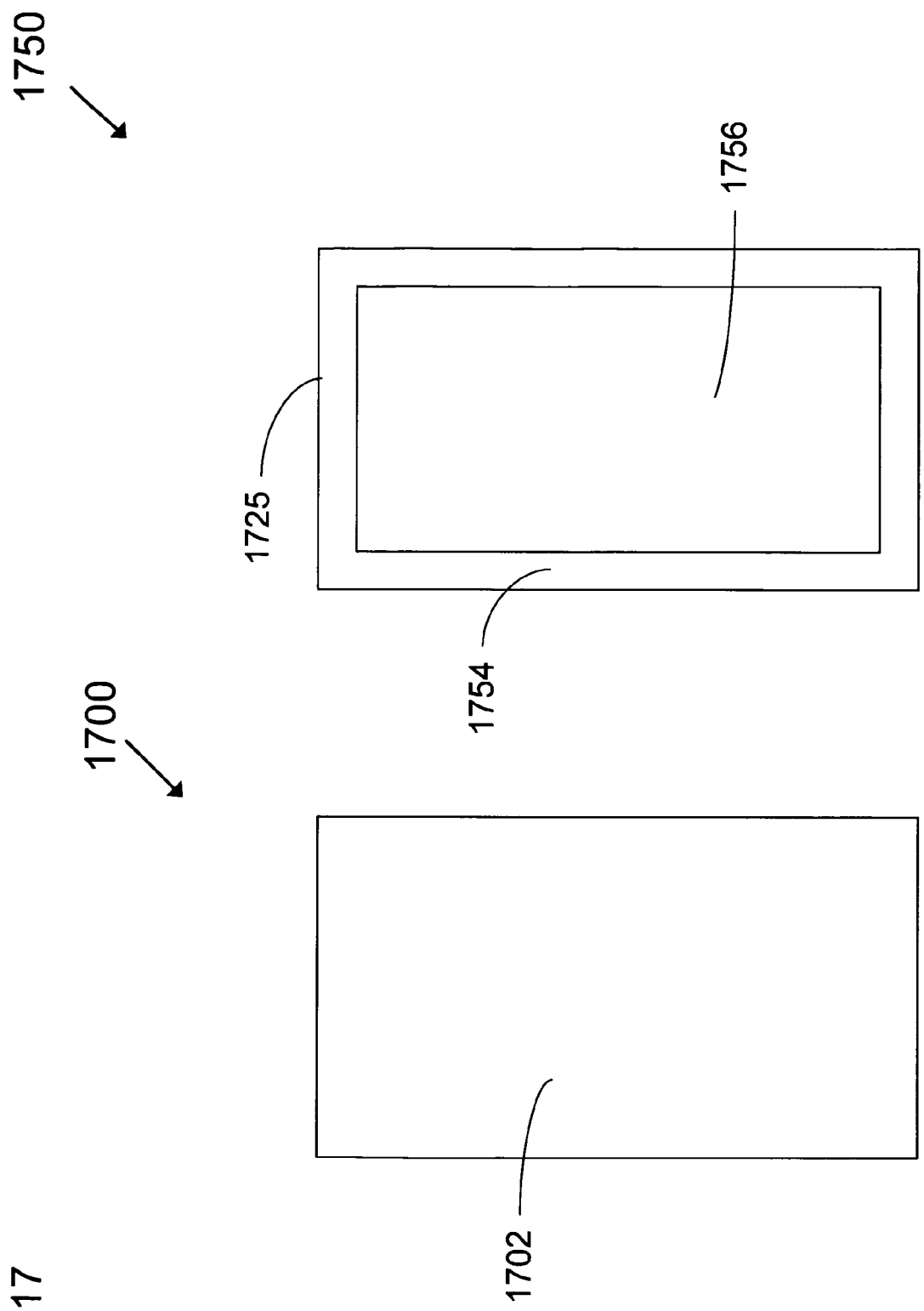
FIG. 17 illustrates configurations of mirrors and frames utilizing, according to embodiments of the invention.

FIG. 17 illustrates configurations of mirrors and frames, according to embodiments of the invention. With reference to FIG. 17, a front view of an outer glass layer and frame assembly from 1550 (FIG. 15) is illustrated at 1700 (FIG. 17). Note that the frame is hidden by the glass layer when viewed from the front side as shown in FIG. 17. At 1750, in FIG. 17, a front view is shown of the outer glass layer and frame assembly from 1650 (FIG. 16).

Figure 18:
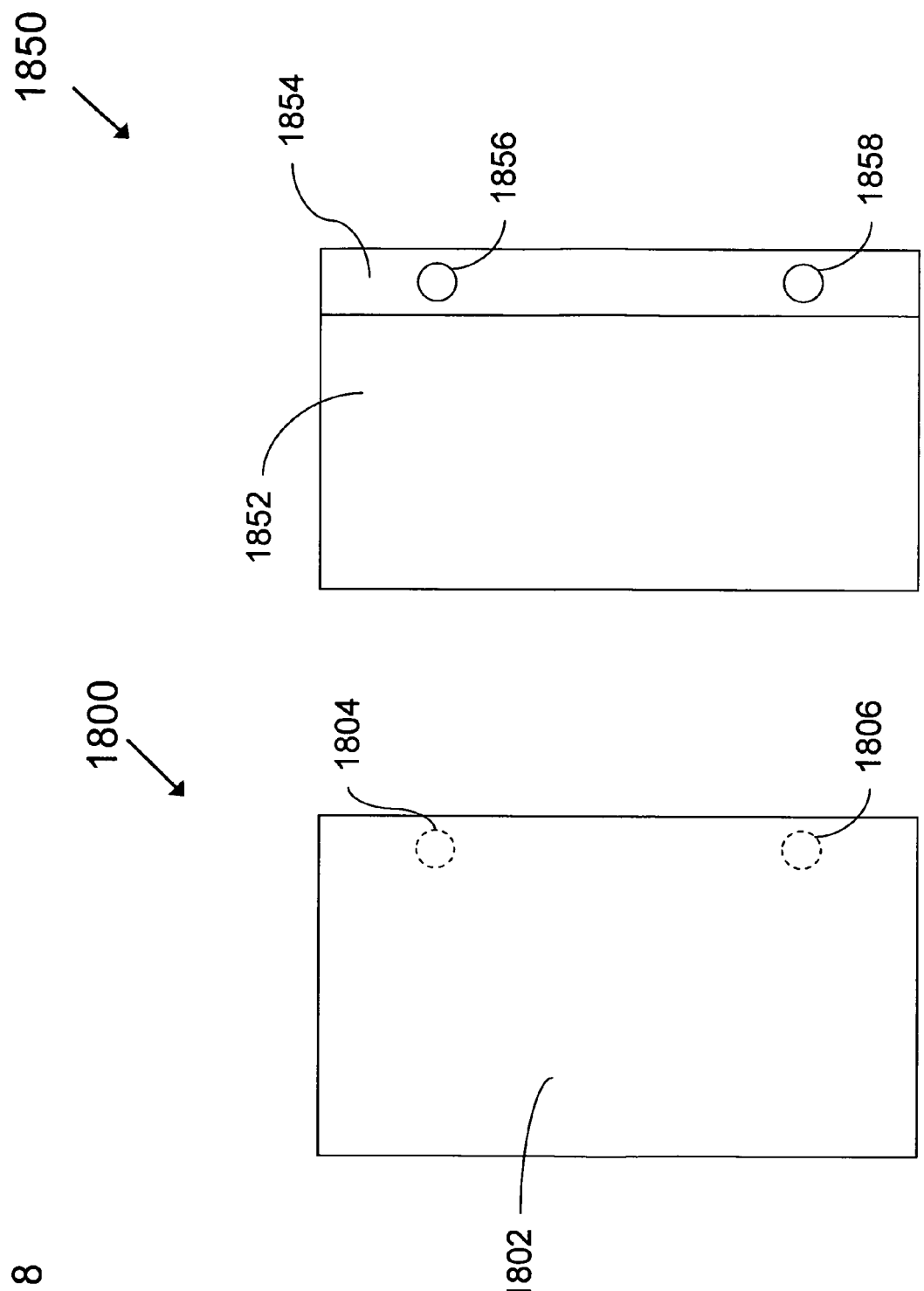
FIG. 18 illustrates integrations of mirrors and frames, according to embodiments of the invention.

FIG. 18 illustrates integrations of mirrors and frames, according to embodiments of the invention. With reference to FIG. 18, at 1800 a glass layer 1802 is shown with optional holes 1804 and 1806. Optional holes 1804 and 1806 are used for hinges that both attach the glass layer 1802 to the medicine cabinet door frame and to the cabinet. In an alternative embodiment, a metal strip 1854 is attached to the glass layer 1852. The metal strip 1854 has a hole 1856 and a hole 1858 into which hinges are used to secure the glass layer 1852 to a frame of the medicine cabinet door and to the cabinet.

The metal strip 1854 is attached to the glass layer 1852 using double sided tape or the two surfaces can be attached by other means such as epoxy.

In various embodiments, a left side of an inner glass layer is prepared with a mounting strip as shown at 1408 (FIG. 14) and a right hand side is prepared with one or the other of the hinge assemblies shown in FIG. 18. The inner glass layer becomes an inside surface covering a medicine cabinet door. In this way the door is hung on the metal strip/inner glass layer.

The frames shown in the preceding figures can be made from a continuous piece of material such as aluminum or stainless steel or a frame can be made from individual pieces, such as four pieces of material that are joined at the corners making up a rectangular or square shape. In one or more embodiments, a series of four aluminum frame parts are joined together to make a frame. Each corner joint is secured by expansion plates that capture adjacent frame parts and apply pressure thereon by means of screws and threaded holes which spread the expansion plates. The frame parts have slots that receive the expansion plates, securing the frame parts together on assembly as the expansion plates spread and press against the frame parts.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described. The description is thus to be regarded as illustrative instead of limiting.

What is claimed is:

1. An apparatus comprising:
   a thin medicine cabinet door, the thin medicine cabinet door has an outer glass layer, the outer glass layer has a front side, a back side, a first area that scatters light, and a second area that reflects light:
   an information display, the information display is mounted on the back side of the outer glass layer, such that a user can view an image displayed on the information display while looking at the front side of the outer glass layer;
   a transducer, the transducer is attached to the back side of the outer glass layer, wherein the transducer vibrates the outer glass layer in response to an input signal and an audible sound is created by the vibration of the outer glass layer; and a backlight assembly, comprising:
  a diffuser, the diffuser is a continuous layer of material which has a first surface and a second surface, the second surface of the diffuser mounted on the back side of the glass layer coincident with the first area, the first surface and the second surface are substantially non-parallel and the first surface is behind the second area; and
  a light source, the light source is positioned on the back side of the second area and is configured to radiate light incident on the first surface of the diffuser resulting in indirect backlight illumination of the first area.

2. The apparatus of claim 1, further comprising:
a defogger, the defogger is attached to the back side of the outer glass layer.

3. The apparatus of claim 1, further comprising:
an inner glass layer, the inner glass layer is attached to an inside surface of the medicine cabinet door, the inner glass layer has a mirror portion and the user can see a reflection in the mirror portion.

4. The apparatus of claim 3, wherein a thickness of the medicine cabinet door is less than 1.2 inch.

5. The apparatus of claim 1, wherein the input signal is related to an image displayed on the information display.

6. The apparatus of claim 5, further comprising:
an information display control, the information display control is mounted to the outer glass layer.

7. The apparatus of claim 6, wherein the information display control uses a wireless signal to control the information display.

8. The apparatus of claim 7, wherein a frequency of the wireless signal is part of the Infrared Spectrum.

9. The apparatus of claim 7, wherein a frequency of the wireless signal is part of the Radio Frequency (RF) spectrum.

10. The apparatus of claim 1, wherein the information display displays a signal received from a television tuner.

11. The apparatus of claim 1, wherein the information display displays a signal received from a video play back device.

12. The apparatus of claim 1, wherein the information display displays a television signal.

13. The apparatus of claim 1, wherein the information display displays a signal that came from the Internet.

14. The apparatus of claim 1, wherein the light source is comprised of an array of light emitting diodes (LEDS).

15. The apparatus of claim 1, wherein the light source is comprised of an array of incandescent bulbs.

16. The apparatus of claim 1, wherein the light source is comprised of a fluorescent tube.

17. The apparatus of claim 1, wherein the light source is positioned at an angle relative to the glass layer in order to decrease a height of the distributed linear light source above the glass layer, wherein the angle is less than ninety degrees and greater than zero degrees.

18. An apparatus, comprising:
a glass layer, the glass layer is configured for use in a medicine cabinet door, the glass layer has a front side, a back side, a first area that scatters light, and a second area that reflects light; and
a backlight assembly, comprising:
  a diffuser, the diffuser is a continuous uniform layer of material which has a first surface and a second surface, the second surface of the diffuser is mounted on the back side of the glass coincident with the first area, the first surface and the second surface are substantially non-parallel and the first surface is behind the second area; and
  a light source, the light source is positioned on the back side of the second area and is configured to radiate light incident on the first surface of the diffuser resulting in indirect backlight illumination of the first area.

19. The apparatus of claim 18, wherein the first area is frosted.

20. The apparatus of claim 19, wherein an acid etch is used to frost the first area.

21. The apparatus of claim 18, wherein the first area is sandblasted.

22. The apparatus of claim 18, wherein the diffuser is made from acrylic plastic.

23. The apparatus of claim 18, wherein at least one side of the diffuser is a color selected to enhance reflection of light.

24. The apparatus of claim 23, wherein the color is white.

25. The apparatus of claim 23, wherein a thickness of the medicine cabinet door is equal to or less than 0.875 inch.

26. The apparatus of claim 18, wherein the diffuser is comprised of at least two distinct diffuser structures.

27. The apparatus of claim 18, wherein the diffuser is made from a single material.

28. The apparatus of claim 18, further comprising:
a metal reflector, the metal reflector is positioned behind the first area and the metal reflector reflects light from the backside of the glass layer through the first area to the front side of the glass layer, thereby facilitating the creation of backlight in the first area.

29. The apparatus of claim 18, wherein the light source is a distributed linear light source.

30. The apparatus of claim 29, wherein the distributed linear light source is comprised of an array of light emitting diodes (LEDS).

31. The apparatus of claim 29, wherein the distributed linear light source is comprised of an array of incandescent bulbs.

32. The apparatus of claim 29, wherein the distributed linear light source is comprised of a fluorescent tube.

33. The apparatus of claim 29, wherein the distributed linear light source is positioned at an angle relative to the glass layer in order to decrease a height of the distributed linear light source above the glass layer, wherein the angle is less than ninety degrees and greater than zero degrees.

34. The apparatus of claim 18, wherein the light source develops a light intensity sufficient to illuminate a user without secondary lighting.

35. The apparatus of claim 32, wherein a thickness of the medicine cabinet door is less than 1.1 inch.

36. The apparatus of claim 18, wherein the first surface is polished.

37. An apparatus, comprising:
a glass layer, the glass layer is configured for use in a medicine cabinet door, the glass layer has a front side, a back side, a first area that scatters light, and a second area that reflects light: and
a backlight assembly, comprising:
  a thin low volume reflector, the reflector has a surface area the reflector is mounted on the back side of the glass layer so that its surface area is coincident with and substantially parallel to the first area; and
  a light source, the light source is mounted on the back side of the glass layer over the second area that reflects light and along an edge of the first area, the light source is configured to radiate light incident on the reflector, such that a source of backlight is provided by light reflected off of the reflector which is to be emitted through the first area when the light source is on and when the medicine cabinet door is viewed from the front side.

38. The apparatus of claim 37, wherein an angle formed between the reflector and the glass layer is in a range of zero degrees to ninety degrees.

39. The apparatus of claim 37, wherein a thickness of the medicine cabinet door is equal to or less than 0.875 inch.

40. The apparatus of claim 37, wherein the light source is comprised of an array of light emitting diodes (LEDS).

41. The apparatus of claim 37. wherein the light source is comprised of an array of incandescent bulbs.

42. The apparatus of claim 37, wherein the light source is comprised of a fluorescent tube.

43. The apparatus of claim 37, wherein the light source is positioned at an angle relative to the glass layer in order to decrease a height of the distributed linear light source above the glass layer, wherein the angle is less than ninety degrees and greater than zero degrees.

\* \* \* \* \*